United States Patent [19]
Kakui

[11] Patent Number: 6,104,526
[45] Date of Patent: Aug. 15, 2000

[54] OPTICAL AMPLIFIER AND A METHOD OF CONTROLLING THE OPTICAL AMPLIFIER

[75] Inventor: Motoki Kakui, Yokohama, Japan

[73] Assignee: Sumitomo Electric Industries, Ltd., Osaka, Japan

[21] Appl. No.: 09/349,503

[22] Filed: Jul. 9, 1999

[30] Foreign Application Priority Data

Jun. 18, 1999 [JP] Japan ..................................... 9-172582

[51] Int. Cl.$^7$ .............................. H01S 3/00; H01S 3/133; H04B 9/00; H04B 10/28
[52] U.S. Cl. .......................... 359/337; 359/161; 359/341; 372/6; 372/34
[58] Field of Search .................................... 359/133, 160, 359/161, 174, 177, 187, 194, 337, 341; 372/6, 34–36

[56] References Cited

U.S. PATENT DOCUMENTS

| | | | |
|---|---|---|---|
| 5,541,766 | 7/1996 | Mizaki et al. | 359/337 |
| 5,673,129 | 9/1997 | Mizaki | 359/133 |
| 5,859,945 | 1/1999 | Kato et al. | 385/89 |
| 5,943,152 | 8/1999 | Mizaki et al. | 359/187 |

FOREIGN PATENT DOCUMENTS

| | | |
|---|---|---|
| 63-318789 | 12/1988 | Japan . |
| 11088086 | 3/1999 | Japan . |

OTHER PUBLICATIONS

"Wide–Dynamic–Range WDM Optical Fiber Amplifiers for 32×10 Gb/s, SMF Transmission Systems", by Kinoshita, et al., OSA Tops, vol. 25, 1998, pp. 280–283.

"EDFA Without Dynamic Gain Tilt Using Excited–State Trapping", by Yadlowsky et al., 1998 Technical Digest, pp. 24–27.

Lee et al, OFC '98, Tech. Digest, pp 133–134, IEEE Cat. No. 98CH36177, Feb. 27, 1998.

Lee et al, IEEE Photonics Techn. Lett., vol. 10, #12, Dec. 1998.

Kentichou et al, Jour. Lightwave Techn., vol. 15 #11, pp 2083–2090, Nov. 1997.

Lee et al, IEEE Photonics Techn. Lett., vol. 10, #8, pp 1168–1170.

*Primary Examiner*—Nelson Moskowitz
*Attorney, Agent, or Firm*—McDermott, Will & Emery

[57] ABSTRACT

In the optical amplifier of the present invention, a part of signal light inputted to an input connector is branched out by an optical coupler, whereby its power is detected by a light-receiving device. According to the power of input signal light detected by the light-receiving device, the temperature of an amplification optical fiber is controlled by a temperature control section by way of a Peltier device. On the other hand, a part of the signal light outputted from an output connector is branched out by an optical coupler, whereby its power is detected by a light-receiving device. The power of pumping light supplied to the amplification optical fiber from an pumping light source 152 is controlled by an output control section 162 such that the power of output signal light detected by the light-receiving device becomes a predetermined target value.

24 Claims, 13 Drawing Sheets

Fig.4
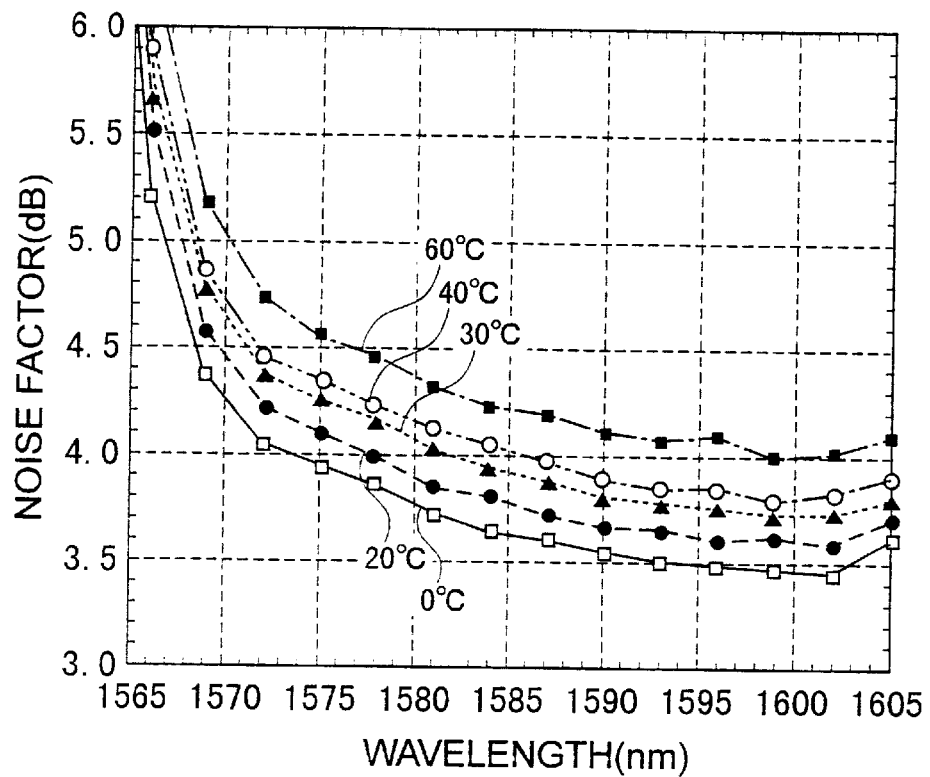
Fig.5A
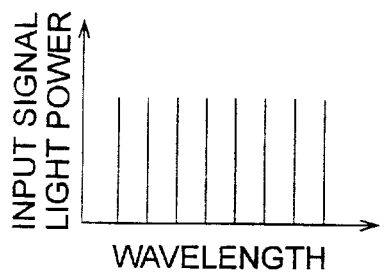
Fig.5B
Fig.5C
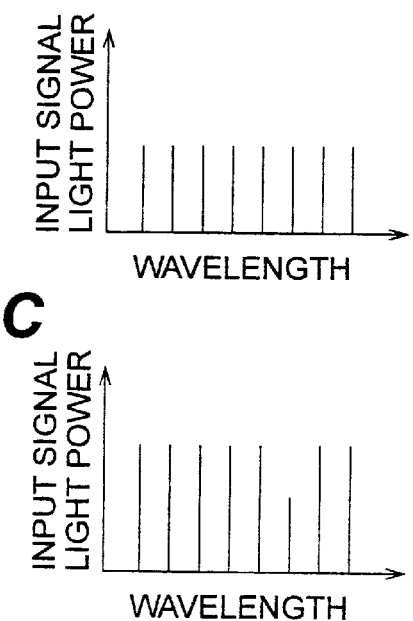

OPTICAL AMPLIFIER AND A METHOD OF CONTROLLING THE OPTICAL AMPLIFIER

BACKGROUND OF THE INVENTION

1. Field of the Invention

The present invention relates to an optical amplifier which can optically amplify a signal light having a plurality of wavelengths of signal light together in an optical transmission system, and a method of controlling such an optical amplifier.

2. Related Background Art

An optical amplifier includes an optical waveguide, doped with a fluorescent material excitable with pumping light, for optically amplifying signal light, and pumping means for supplying the pumping light to the optical waveguide; and is disposed in a repeater station in an optical transmission system, or the like.

The optical amplifier disclosed in Reference 1, S. Kinoshita, et al., "Wide-dynamic-Range WDM Optical Fiber Amplifiers for 32×10 Gb/s, SMF Transmission Systems," OSA TOPS Vol. 25, pp. 280–283 (1998), is provided with an optical attenuator having a variable amount of attenuation, in order to adjust its gain while maintaining a flatness in gain. On the other hand, the optical amplifier disclosed in Reference 2, M. J. Yadlowsky, "EDFA without dynamic gain tilt using excite-state trapping," OSA TOPS Vol. 25, pp. 24– 27 (1998), is provided with a light source for outputting control light (having a wavelength of 977.5 nm) which brings a fluorescent material (Er element) to its excited level, separately from an pumping light source for outputting pumping light (having a wavelength of 1470 nm), in order to adjust its gain while maintaining a flatness in gain.

SUMMARY OF THE INVENTION

In order to overcome problems of the above-mentioned examples, it is an object of the present invention to provide an optical amplifier and optical amplifier control method which can suppress the deterioration in its optical amplification performance and easily maintain a flatness in gain even when the power of input signal light fluctuates.

The optical amplifier in accordance with the present invention comprises an optical waveguide, doped with a fluorescent material excitable with pumping light, for optically amplifying signal light; pumping means for supplying pumping light to the optical waveguide; output control means for controlling signal light outputted from the optical waveguide, such that a power of the signal light becomes a predetermined target value; and temperature control means for controlling a temperature of at least a part of the optical waveguide according to a power of the signal light inputted to the optical waveguide.

The optical amplifier control method in accordance with the present invention uses an optical amplifier comprising an optical waveguide, doped with a fluorescent material excitable with pumping light, for optically amplifying signal light, and pumping means for supplying pumping light to the optical waveguide, so as to control the signal light outputted from the optical waveguide, such that a power of the signal light becomes a predetermined target value, and control a temperature of at least a part of the optical waveguide according to a power of the signal light inputted to the optical waveguide. Preferably, for controlling the temperature of the optical waveguide, letting G (unit: dB) be a set center value of a range for adjusting net gain in the part of optical waveguide controlled by the temperature control means, and A (unit: 1/K) be a constant, the target value (unit: K) of the temperature of the optical waveguide is changed with respect to the amount of change $\Delta P$ (unit: dB) in power of the signal light inputted to the optical waveguide by $\Delta P/(A \cdot G)$.

According to this optical amplifier and optical amplifier control method, the power of signal light (which may be either the whole signal light or a specific wavelength of signal light) outputted from the optical waveguide is controlled so as to have a predetermined target value, and the temperature of at least a part of the optical waveguide is controlled according to the power of the signal light (which may be either the whole signal light or a specific wavelength of signal light) inputted to the optical waveguide. As a consequence, even when the input signal light power fluctuates, the deterioration in optical amplification performances is suppressed, whereby the flatness in gain can easily be maintained.

In another aspect, the optical amplifier in accordance with the present invention comprises an optical waveguide, doped with a fluorescent material excitable with pumping light, for optically amplifying signal light; pumping means for supplying pumping light to the optical waveguide; output control means for controlling signal light outputted from the optical waveguide, such that a power of the signal light becomes a predetermined target value; and temperature control means for controlling a temperature of at least a part of the optical waveguide according to a gain of optical amplification in the optical waveguide.

In another aspect, the optical amplifier control method in accordance with the present invention uses an optical amplifier comprising an optical waveguide, doped with a fluorescent material excitable with pumping light, for optically amplifying signal light, and pumping means for supplying pumping light to the optical waveguide, so as to control the signal light outputted from the optical waveguide, such that a power of the signal light becomes a predetermined target value, and control a temperature of at least a part of the optical waveguide according to a gain of optical amplification in the optical waveguide. Preferably, for controlling the temperature of the optical waveguide, letting G (unit: dB) be a set center value of a range for adjusting net gain in the part of optical waveguide controlled by the temperature control means, and A (unit: 1/K) be a constant, the target value (unit: K) of the temperature of the optical waveguide is changed with respect to the amount of change $\Delta G$ (unit: dB) in gain by $-\Delta G/(A \cdot G)$.

According to this optical amplifier and optical amplifier control method, the power of signal light (which may be either the whole signal light or a specific wavelength of signal light) outputted from the optical waveguide is controlled so as to have a predetermined target value, and the temperature of at least a part of the optical waveguide is controlled according to the gain of optical amplification in the optical waveguide. As a consequence, even when the input signal light power fluctuates, and even if this fluctuation is caused by fluctuations in wave number, the deterioration in optical amplification performances is suppressed, whereby the flatness in gain can easily be maintained. Here, the gain may be determined by detecting each of the input signal light power and output signal light power and then calculating the ratio therebetween, or determined from the ratio between the output signal light power of an optical amplifier in the previous stage and the input signal light power of the own optical amplifier.

In a further aspect, the optical amplifier in accordance with the present invention comprises an optical waveguide, doped with a fluorescent material excitable with pumping light, for optically amplifying signal light; pumping means for supplying pumping light to the optical waveguide; output control means for controlling signal light outputted from the optical waveguide, such that a power of the signal light becomes a predetermined target value; and temperature control means for controlling a temperature of at least a part of the optical waveguide according to a difference between respective powers of at least two waves of signal light outputted from the optical waveguide.

In a further aspect, the optical amplifier control method in accordance with the present invention uses an optical amplifier comprising an optical waveguide, doped with a fluorescent material excitable with pumping light, for optically amplifying signal light and pumping means for supplying pumping light to the optical waveguide, so as to control the signal light outputted from the optical waveguide, such that a power of the signal light becomes a predetermined target value, and control a temperature of at least a part of the optical waveguide according to a difference between respective powers of at least two waves of signal light outputted from the optical waveguide.

According to this optical amplifier and optical amplifier control method, the power of signal light (which may be either the whole signal light or a specific wavelength of signal light) outputted from the optical waveguide is controlled so as to have a predetermined target value, and the temperature of at least a part of the optical waveguide is controlled according to the difference between respective powers of at least two waves outputted from the optical waveguide. As a consequence, even when the input signal light power fluctuates, the deterioration in optical amplification performances is suppressed, whereby the flatness in gain can easily be maintained. Also, since the temperature of the optical waveguide is feedback-controlled, stable operations of optical amplification are possible.

In each of the above-mentioned optical amplifiers and optical amplifier control methods in accordance with the present invention, the optical waveguide may be divided into a plurality of sections, and the temperature control means may maintain a constant temperature in the most upstream section in the optical waveguide. In this case, the deterioration in noise characteristics of the optical waveguide caused by changes in temperature can be avoided in the optical amplifier as a whole.

In the above-mentioned optical amplifiers and optical amplifier control methods in accordance with the present invention, the fluorescent material may be Er element. In this case, signal light can be optically amplified within the signal light wavelength band of 1.53 to 1.60 nm, which is generally used in optical communications systems. In particular, one in which the optical waveguide optically amplifies signal light within the range of 1574 to 1601 nm is preferable. In this case, even when the input signal light power fluctuates, a flatness in gain can be maintained over a wide band ranging 25 nm or more.

BRIEF DESCRIPTION OF THE DRAWINGS

FIG. 4 is a graph showing wavelength dependence characteristics of noise factor measured immediately in front of the amplification optical fiber in the optical amplifier in accordance with the first embodiment for respective values of input signal light power;

FIG. 5A is a chart for explaining the state of each wavelength of signal light;

FIG. 5B is a chart for explaining a state of power fluctuation in the case where individual wavelengths of input signal light change uniformly;

FIG. 5C is a chart for explaining a power fluctuation in the case where the power of a certain wavelength of input signal light changes differently from the power of the other wavelengths of input signal light;

DESCRIPTION OF THE PREFERRED EMBODIMENTS

In the following, embodiments of the present invention will be explained in detail with reference to the accompanying drawings. In the explanation of the drawings, constituents identical to each other will be referred to with numerals identical to each other without their overlapping descriptions repeated.

First Embodiment

Figure 1:
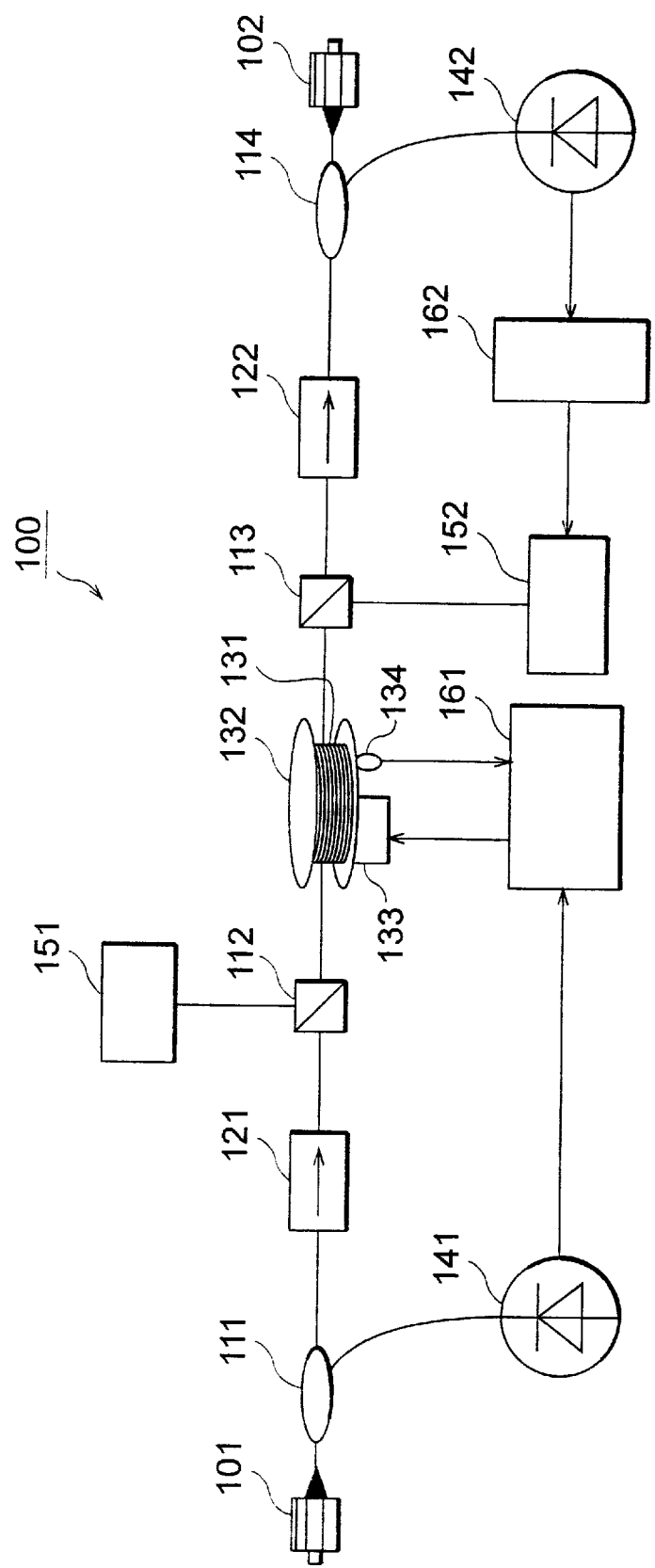
FIG. 1 is a configurational view of the optical amplifier in accordance with a first embodiment.

To begin with, the first embodiment of the optical amplifier and optical amplifier control method in accordance with the present invention will be explained. FIG. 1 is a configurational view of the optical amplifier 100 in accordance with the first embodiment. The optical amplifier 100 in accordance with this embodiment controls the temperature of at least a part of the amplification optical fiber according to the power of inputted signal light.

In the optical amplifier 100 in accordance with this embodiment, from an input connector 101 to an output connector 102, an optical coupler 111, an optical isolator 121, an optical coupler 112, an amplification optical fiber 131, an optical coupler 113, an optical isolator 122, and an optical coupler 114 are successively cascaded to one another. Also, in the optical amplifier 100 in accordance with this embodiment, a light-receiving device 141 is connected to the optical coupler 11, an pumping light source 151 is connected to the optical coupler 112, an pumping light source 152 is connected to the optical coupler 113, and a light-receiving device 142 is connected to the optical coupler 114. Further, the optical amplifier 100 in accordance with this embodiment is equipped with a temperature control section 161 and an output control section 162.

The optical coupler 111 causes a part of signal light having arrived from the input connector 101 to branch off toward the light-receiving device 141, and the remainder to pass therethrough to the optical isolator 121. The light-receiving device 141 is a photodiode, for example, receives the part of signal light branched out by the optical coupler 111, and outputs an electric signal indicative of the power of input signal light. The optical isolator 121 transmits therethrough light in the direction from the optical coupler 111 to the optical coupler 112, but not in the opposite direction. The optical coupler 112 outputs to the amplification optical fiber 131 the signal light having arrived from the optical isolator 121, and also outputs to the amplification optical fiber 131 the pumping light outputted from the pumping light source 151. The pumping light source 151 is a semiconductor laser light source, for example, and outputs pumping light with a wavelength which can excite a fluorescent material added to the amplification optical fiber 131.

The amplification optical fiber 131 is an optical waveguide whose core is doped with a fluorescent material excitable with the pumping light outputted from the pumping light sources 151, 152, optically amplifies signal light, and outputs thus amplified signal light. The doping fluorescent material is preferably a rare-earth element, more preferably Er element. Doping with Er element is preferable since signal light in the wavelength band of 1.55 $\mu$m can be optically amplified thereby. The amplification optical fiber 131 is wound around a coil bobbin 132 made of a material (e.g., aluminum) which is excellent in thermal conductivity. Attached to the coil bobbin 132 are a Peltier device 133 for adjusting the temperature of the amplification optical fiber 131, and a thermistor 134 for detecting the temperature of the amplification optical fiber 131.

The optical coupler 113 outputs to the optical isolator 122 the signal light outputted from the amplification optical fiber 131, and outputs to the amplification optical fiber 131 the pumping light outputted from the pumping light source 152. The pumping light source 152 is a semiconductor laser light source, for example, and outputs pumping light with a wavelength which can excite the fluorescent material added to the amplification optical fiber 131. The optical isolator 122 transmits therethrough light in the direction from the optical coupler 113 to the optical coupler 114, but not in the opposite direction. The optical coupler 114 causes a part of signal light having arrived from the optical isolator 122 to branch off toward the light-receiving device 142, and the remainder to pass therethrough to the output connector 102. The light-receiving device 142 is a photodiode, for example, receives the part of signal light branched out by the optical coupler 114, and outputs an electric signal indicative of the power of output signal light.

According to the power of input signal light detected by the light-receiving device 141, the temperature control section 161 controls the temperature of the amplification optical fiber 131 by way of the Peltier device 133, while monitoring the result of temperature measurement effected by the thermistor 134. On the other hand, the output control section 162 controls the power of pumping light supplied to the amplification optical fiber 131 from the pumping light source 152, such that the power of output signal light detected by the light-receiving device 142 becomes a predetermined target value.

The optical amplifier 100 in accordance with this embodiment operates as follows. The pumping light outputted from the pumping light source 151 is forwardly supplied to the amplification optical fiber 131 by way of the optical coupler 112, whereas the pumping light outputted from the pumping light source 152 is reversely supplied to the amplification optical fiber 131 by way of the optical coupler 113. The signal light inputted to the input connector 101 successively travels through the optical coupler 111, the optical isolator 121, and the optical coupler 112, so as to be inputted to and optically amplified in the amplification optical fiber 131. The signal light optically amplified in and outputted from the amplification optical fiber 131 successively travels through the optical coupler 113, the optical isolator 122, and the optical coupler 114, so as to be outputted from the output connector 102.

A part of the signal light inputted to the input connector 101 is branched out by the optical coupler 111, so that its power is detected by the light-receiving device 141. According to the power of input signal light detected by the light-receiving device 141, the temperature of the amplification optical fiber 131 is controlled by the temperature control section 161 by way of the Peltier device 133. On the other hand, a part of the signal light outputted from the output connector 102 is branched out by the optical coupler 114, so that its power is detected by the light-receiving device 142. Also, the power of the pumping light supplied to the amplification optical fiber 131 from the pumping light source 152 is controlled by the output control section 162 so that the power of output signal light detected by the light-receiving device 142 becomes a predetermined target value.

More specifically, the optical amplifier 100 in accordance with this embodiment is constituted as follows. The amplification optical fiber 131 is a silica type optical fiber whose core is doped with Er element and Al element, having an Er element doping concentration of 3700 wt.ppm, a length of 15 mm, a cutoff wavelength of 1.1 $\mu$m, and an absorption of about 50 dB/m at a wavelength of 1.53 $\mu$m. The pumping light source 151 for forwardly supplying pumping light to the amplification optical fiber 131 is a semiconductor laser light source which outputs laser light having a wavelength of 1.48 $\mu$m, thereby supplying pumping light having a power of 97 mW to the amplification optical fiber 131. The pumping light source 152 for reversely supplying pumping light to the amplification optical fiber 131 is a semiconductor laser light source which outputs laser light having a wavelength of 1.48 $\mu$m, and the pumping light supplied to the amplification optical fiber 131 is controlled by the output control section 162 so that the output signal light power detected by the light-receiving device 142 becomes a predetermined target value.

Let signal lights having plurality of wavelengths within the wavelength range of L band, i.e., 1574 to 1601 nm, be inputted to the input connector 101, the powers of the respective wavelengths of the signal lights fluctuate in the same manner, and the total power fluctuate within the range of −13 to −9 dBm. Let the temperature of the amplification optical fiber 131 be 30° C. when the total of the powers of the input signal lights is −11 dBm, which is defined as a reference state.

Then, when the total of the powers of the input signal lights is increased by ΔP (unit: dB) from the reference state due to the temperature control carried out by the temperature control section 161 according to the result of detection of the input signal light power effected by the light-receiving device 141, the temperature of the amplification optical fiber 131 is raised by the temperature difference ΔT (unit: K) represented by the following expression:

$$\Delta T = \Delta P/(A \cdot G). \quad (1)$$

Here, G (unit: dB) is a set center value of a range for adjusting net gain in the amplification optical fiber 131, which is the value of gain of optical amplification in the amplification optical fiber 131 at a temperature of 30° C., i.e., 26 dB, in this case. Also, A (unit: 1/K) is a constant determined by the composition of the amplification optical fiber 131 and the signal light wavelength band, which is at a value of $2.6 \times 10^{-3}$/K in this case.

Here, when the total of the powers of the input signal lights is −13 dBm, the temperature of the amplification optical fiber 131 is set to 0° C. When the total of the powers of the input signal lights is −11.67 dBm, the temperature of the amplification optical fiber 131 is set to 20° C. When the total of the powers of the input signal lights is −11 dBm, the temperature of the amplification optical fiber 131 is set to 30° C. When the total of the powers of the input signal lights is −10.33 dBm, the temperature of the amplification optical fiber 131 is set to 40° C. When the total of the powers of the input signal lights is −9 dBm, the temperature of the amplification optical fiber 131 is set to 60° C.

Figure 2:
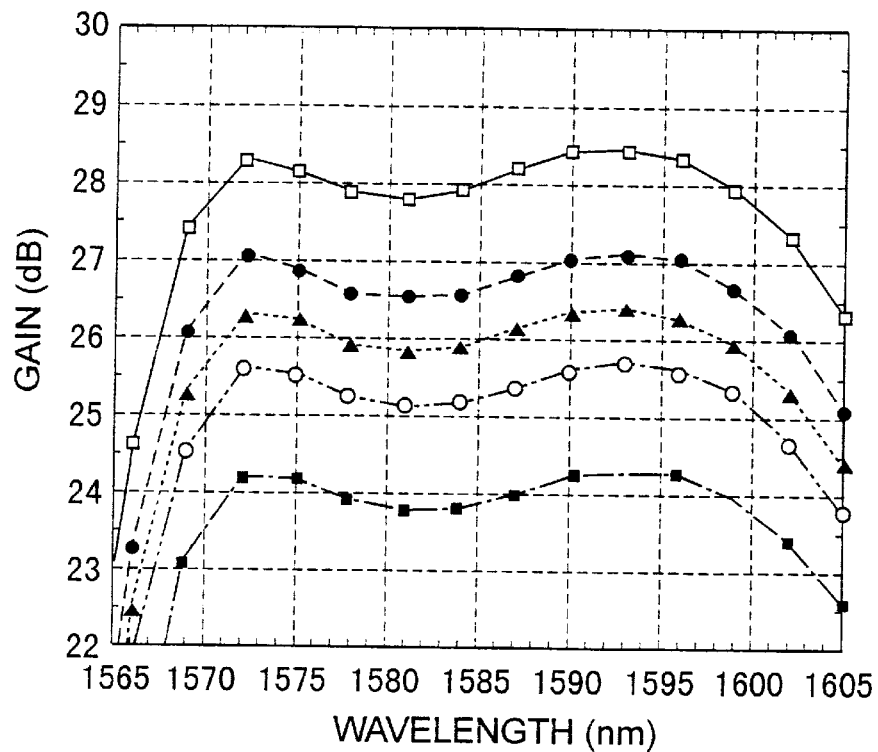
FIG. 2 is a graph showing gain spectra of the amplification optical fiber in the optical amplifier in accordance with the first embodiment for respective values of input signal light power.
Figure 3:
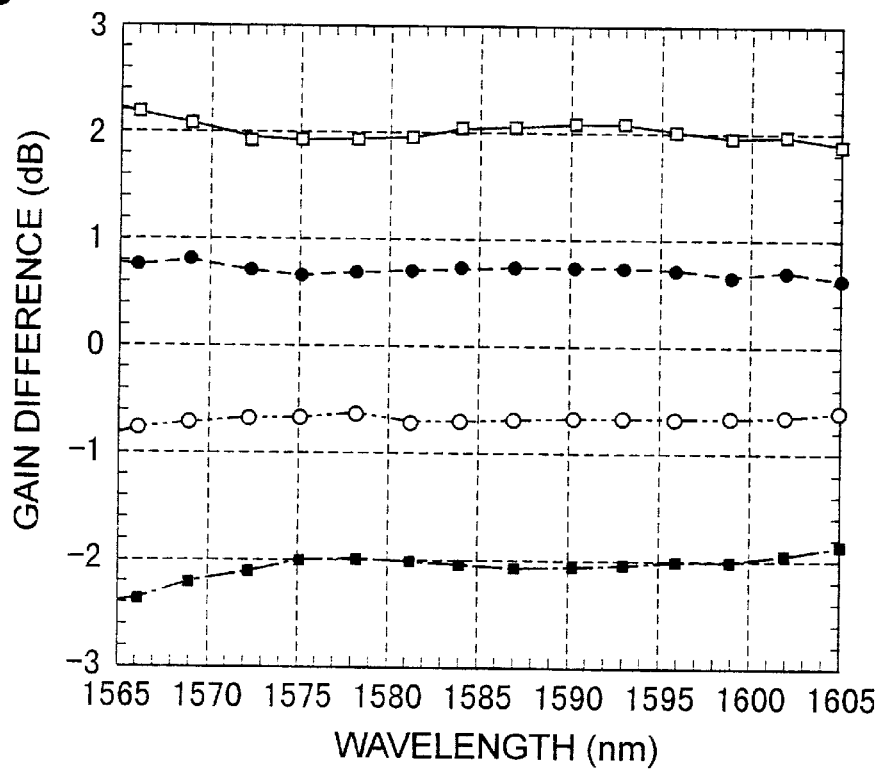
FIG. 3 is a graph showing changes in gain of the optical amplifier in accordance with the first embodiment for respective values of input signal light power with reference to the gain obtained when the total of the powers of the input signal lights is −11 dBm (at a temperature of 30° C.)

FIG. 2 is a graph showing gain spectra of the amplification optical fiber 131 in the optical amplifier 100 in accordance with the first embodiment for respective values of input signal light power. FIG. 3 is a graph showing changes in gain of the optical amplifier 100 in accordance with the first embodiment for respective values of input signal light power with reference to the gain obtained when the total of the powers of the input signal lights is −11 dBm (at a temperature of 30° C.).

As can be seen from these graphs, with reference to the case where the input signal light power is −11 dBm (at a temperature of 30° C.), the gain changes by about +2 dB when the input signal light power changes by −2 dB (−13 dBm, at a temperature of 0° C.), the gain changes by about +0.67 dB when the input signal light power changes by −0.67 dB (−11.67 dBm, at a temperature of 20° C.), the gain changes by about −0.67 dB when the input signal light power changes by +0.67 dB (−10.33 dBm, at a temperature of 40° C.), and the gain changes by about −2 dB when the input signal light power changes by +2 dB (−9 dBm, at a temperature of 60° C.).

As a consequence, in the optical amplifier 100 in accordance with this embodiment, even when the power of input signal light fluctuates, the power of output signal light attains a predetermined target value, and the form of gain spectrum is kept constant. In particular, the fluctuation in output power of individual wavelengths of signal light is within ±0.1 dB within the wavelength band of 1574 to 1601 nm. While the unevenness in gain spectrum increases in the one disclosed in the above-mentioned Reference 2 as the gain increases, the unevenness in gain spectrum would not increase in the optical amplifier 100 in accordance with this embodiment even when the gain increases, whereby the form of gain spectrum is kept constant. Namely, when signal light within the wavelength band of 1574 to 1601 nm is used, even if the power of input signal light fluctuates within the range of −11±2 dBm, the optical amplifier 100 in accordance with this embodiment keeps the powers of individual wavelengths of output signal light constant, while maintaining a flatness in gain.

FIG. 4 is a graph showing wavelength dependence characteristics of noise factor measured immediately in front of the amplification optical fiber 131 in the optical amplifier 100 in accordance with the first embodiment for respective values of input signal light power. As can be seen from this graph, since signal light is not attenuated by optical attenuators, large increases in noise factor and deterioration in optical amplification performances can be suppressed without lowering the pumping efficiency.

In this embodiment, as explained in the foregoing, even when the input signal light power fluctuates, the deterioration in optical amplification performances can be suppressed, whereby a flatness in gain can easily be maintained. As compared with the one disclosed in Reference 1 indicated in the section of Related Background Art, it is not necessary to provide a variable optical attenuator in this embodiment, thus making it possible to eliminate unnecessary losses to signal light in the optical amplifier, whereby the pumping efficiency would improve. Also, as compared with the on e disclosed in Reference 2 indicated in the section of Related Background Art, it is not necessary to provide a light source for outputting control light in this embodiment, whereby the cost is cut down, and the reliability would improve.

Though the temperature of the amplification optical fiber 131 is changed within the range of 30° C.±30 K in the foregoing, adjusting the temperature of the amplification optical fiber 131 over a wider temperature range can respond to wider fluctuations in input signal light power. Also, in the optical amplifier 100 having the configuration shown in FIG. 1, since the light-receiving device 142 detects the power of not only the output signal light but also the ASE light, the output signal light power would not be constant in the strict sense.

Further, a case where the individual wavelengths of inputted signal light uniformly change as shown in FIGS. 5A and 5B (from FIG. 5A to FIG. 5B) has been assumed in the foregoing. However, there may be a case where the power of a certain wavelength of input signal light changes differently from the power of the other wavelengths of input signal light due to problems in the light source or the like (from FIG. 5A to FIG. 5C). In the latter case, it is preferred that the temperature of the amplification optical fiber be controlled according to a required gain as in second to fourth embodiments which will be explained in the following, instead of controlling the temperature of the amplification optical fiber according to the total of the powers of the input signal lights as in the first embodiment.

Second Embodiment

Figure 6:
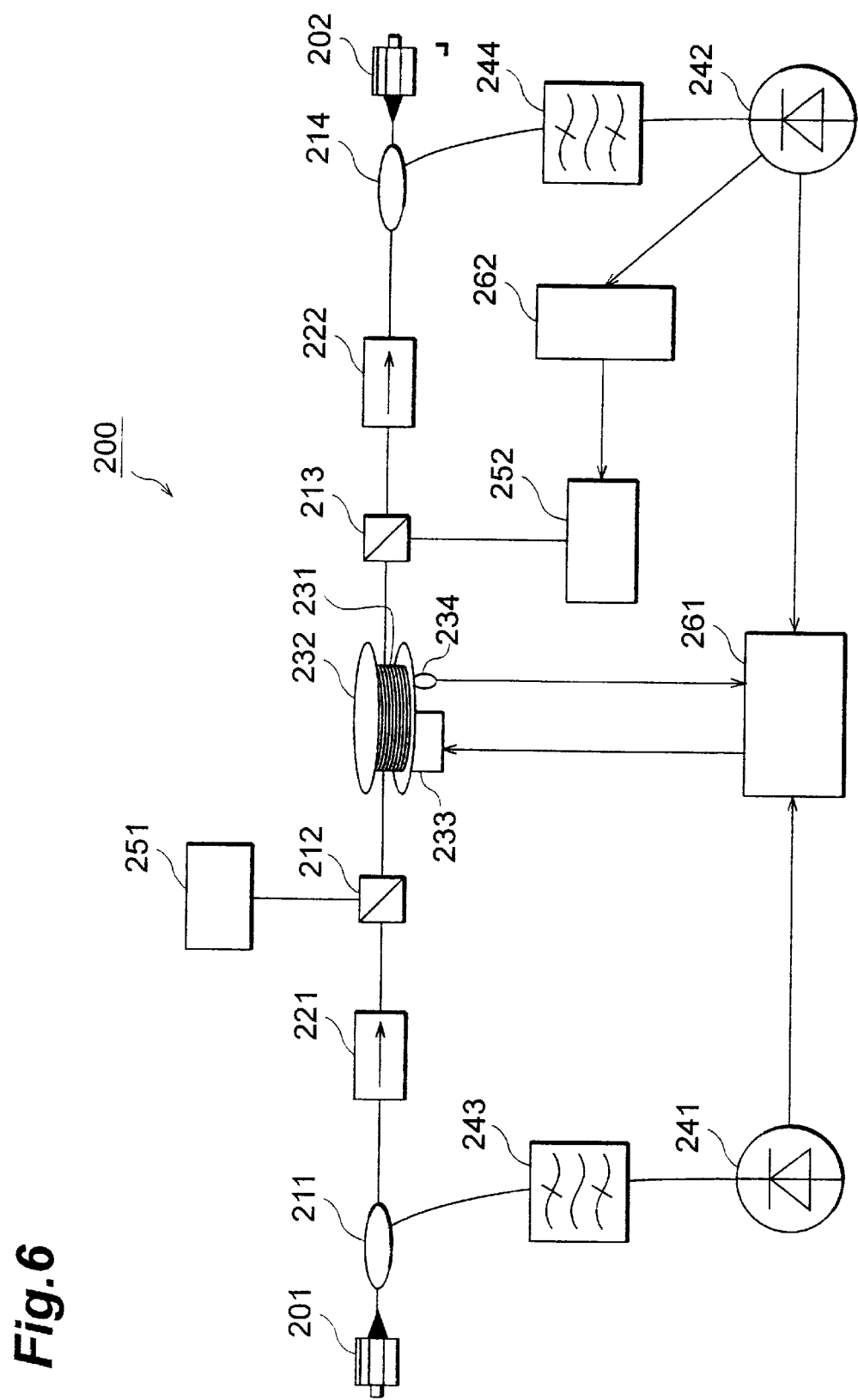
FIG. 6 is a configurational view of the optical amplifier in accordance with a second embodiment.

In the following, the second embodiment of the optical amplifier and optical amplifier control method in accordance with the present invention will be explained. FIG. 6 is a configurational view of the optical amplifier 200 in accordance with the second embodiment. The optical amplifier 200 in accordance with this embodiment determines a gain of optical amplification in an amplification optical fiber from the ratio between the input signal light power and the output signal light power, and controls the temperature of at least a part of the amplification optical fiber according to this gain.

In the optical amplifier 200 in accordance with this embodiment, from an input connector 201 to an output connector 202, an optical coupler 211, an optical isolator 221, an optical coupler 212, an amplification optical fiber 231, an optical coupler 213, an optical isolator 222, and an optical coupler 214 are successively cascaded to one another. Also, in the optical amplifier 200 in accordance with this embodiment, a light-receiving device 241 is connected to the optical coupler 211 by way of a band-pass filter 243, an pumping light source 251 is connected to the optical coupler 212, an pumping light source 252 is connected to the optical coupler 213, and a light-receiving device 242 is connected to the optical coupler 214 by way of a band-pass filter 244.

Further, the optical amplifier 200 in accordance with this embodiment is equipped with a temperature control section 261 and an output control section 262.

The optical coupler 211 causes a part of signal light having arrived from the input connector 201 to branch off toward the band-pass filter 243, and the remainder to pass therethrough to the optical isolator 221. The light-receiving device 241 is a photodiode, for example, receives a part of a specific wavelength of the signal light branched out by the optical coupler 211 and passed through the band-pass filter 243, and outputs an electric signal indicative of the power of the specific wavelength of input signal light. The optical isolator 221 transmits therethrough light in the direction from the optical coupler 211 to the optical coupler 212, but not in the opposite direction. The optical coupler 212 outputs to the amplification optical fiber 231 the signal light having arrived from the optical isolator 221, and also outputs to the amplification optical fiber 231 the pumping light outputted from the pumping light source 251. The pumping light source 251 is a semiconductor laser light source, for example, and outputs pumping light with a wavelength which can excite a fluorescent material added to the amplification optical fiber 231.

The amplification optical fiber 231 is an optical waveguide whose core is doped with a fluorescent material excitable with the pumping light outputted from the pumping light sources 251, 252, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 231 is wound around a coil bobbin 232 made of a material (e.g., aluminum) which is excellent in thermal conductivity. Attached to the coil bobbin 232 are a Peltier device 233 for adjusting the temperature of the amplification optical fiber 231, and a thermistor 234 for detecting the temperature of the amplification optical fiber 231.

The optical coupler 213 outputs to the optical isolator 222 the signal light outputted from the amplification optical fiber 231, and outputs to the amplification optical fiber 231 the pumping light outputted from the pumping light source 252. The pumping light source 252 is a semiconductor laser light source, for example, and outputs pumping light with a wavelength which can excite the fluorescent material added to the amplification optical fiber 231. The optical isolator 222 transmits therethrough light in the direction from the optical coupler 213 to the optical coupler 214, but not in the opposite direction. The optical coupler 214 causes a part of signal light having arrived from the optical isolator 222 to branch off toward the band-pass filter 244, and the remainder to pass therethrough to the output connector 202. The light-receiving device 242 is a photodiode, for example, receives a part of a specific wavelength of the signal light branched out by the optical coupler 214 and passed through the band-pass filter 244, and outputs an electric signal indicative of the power of the specific wavelength of output signal light. Here, the band-pass filters 243 and 244 have transmission characteristics identical to each other. Also, the specific wavelength is 1571 nm, for example.

According to the respective powers of specific wavelength of input signal light detected by the light-receiving devices 241 and 242, the temperature control section 261 calculates a gain of optical amplification in the amplification optical fiber 231. Then, according to this gain, the temperature control section 261 controls the temperature of the amplification optical fiber 231 by way of the Peltier device 233, while monitoring the result of temperature measurement effected by the thermistor 234. On the other hand, the output control section 262 controls the power of pumping light supplied to the amplification optical fiber 231 from the pumping light source 252, such that the power of output signal light detected by the light-receiving device 242 becomes a predetermined target value.

The optical amplifier 200 in accordance with this embodiment operates as follows. The pumping light outputted from the pumping light source 251 is forwardly supplied to the amplification optical fiber 231 by way of the optical coupler 212, whereas the pumping light outputted from the pumping light source 252 is reversely supplied to the amplification optical fiber 231 by way of the optical coupler 213. The signal light inputted to the input connector 201 successively travels through the optical coupler 211, the optical isolator 221, and the optical coupler 212, so as to be inputted to and optically amplified in the amplification optical fiber 231. The signal light optically amplified in and outputted from the amplification optical fiber 231 successively travels through the optical coupler 213, the optical isolator 222, and the optical coupler 214, so as to be outputted from the output connector 202.

A part of the signal light inputted to the input connector 201 is branched out by the optical coupler 211, and a specific wavelength component thereof passes through the band-pass filter 243, so that its power is detected by the light-receiving device 241. On the other hand, a part of the signal light outputted from the output connector 202 is branched out by the optical coupler 214, and a specific wavelength component thereof passes through the band-pass filter 244, so that its power is detected by the light-receiving device 242. Then, according to the respective powers of the specific wavelength of signal light detected by the light-receiving device 241 and light-receiving device 242, the temperature control section 261 calculates a gain of optical amplification in the amplification optical fiber 231, and the temperature of the amplification optical fiber 231 is controlled according to this gain by way of the Peltier device 233. Also, the power of the pumping light supplied to the amplification optical fiber 231 from the pumping light source 252 is controlled by the output control section 262 so that the power of specific wavelength of output signal light detected by the light-receiving device 242 becomes a predetermined target value.

More specifically, the optical amplifier 200 in accordance with this embodiment is constituted as follows. The amplification optical fiber 231 in this embodiment is similar to the amplification optical fiber 131 in the first embodiment. Also, the pumping light sources 251, 252 in this embodiment are substantially similar to the pumping light sources 151, 152 in the first embodiment.

Let signal lights having plurality of wavelengths within the wavelength range of L band, i.e., 1574 to 1601 nm, be inputted to the input connector 201. Also, let the specific wavelength of signal light passed through the band-pass filters 243, 244 and received by the light-receiving devices 241, 242 be signal light having a wavelength of 1571 nm. Let $P_{r1}$ (unit: dBm) be the power of the specific wavelength of signal light received by the light-receiving device 241, and $P_{r2}$ (unit: dBm) be the power of the specific wavelength of signal light received by the light-receiving device 242. Then, the gain G (unit: dB) of optical amplification with respect to this specific wavelength of signal light is represented by the following expression:

$$G = P_{r2} - P_{r1}. \quad (2)$$

In this embodiment, in the pumping light source 252, the pumping light supplied to the amplification optical fiber 231 is controlled by the output control section 262 such that the specific wavelength output signal light power $P_{r2}$ detected by the light-receiving device 242 becomes a predetermined target value. Also, when the gain G with respect to the specific wavelength of signal light is at a desirable value, then the temperature of the amplification optical fiber 231 is set to 30° C., which is defined as a reference state.

Then, when the gain of the specific wavelength of signal light is increased by ΔG (unit: dB) from the reference state due to the temperature control carried out by the temperature control section 261 according to the result of calculation of gain, the temperature of the amplification optical fiber 231 is raised by the temperature difference ΔT (unit: K) represented by the following expression:

$$\Delta T = -\Delta G/(A \cdot G). \quad (3)$$

Here, G (unit: dB) is a set center value of a range for adjusting net gain in the amplification optical fiber 231, which is the value of gain of optical amplification in the amplification optical fiber 231 at a temperature of 30° C., i.e., 26 dB, in this case. Also, A (unit: 1/K) is a constant determined by the composition of the amplification optical fiber 231 and the signal light wavelength band, which is at a value of $2.6 \times 10^{-3}$/K in this case.

Characteristics similar to the respective graphs shown in FIGS. 2 to 4 are obtained in this embodiment as well. Namely, not only in the case where the total of the powers of the input signal lights fluctuates but also in the case where the power of a certain wavelength of input signal light changes differently from the power of the other wavelengths of input signal light, the power of output signal light would attain a predetermined target value, and the form of gain spectrum would be kept constant. In particular, the fluctuation in output power of individual wavelengths of signal light is within ±0.1 dB within the wavelength band of 1574 to 1601 nm. When signal light within the wavelength band of 1574 to 1601 nm is used, even if the power of input signal light fluctuates within the range of −11±2 dBm, the optical amplifier 200 in accordance with this embodiment can keep the powers of individual wavelengths of output signal light constant, while maintaining a flatness in gain. Also, in the optical amplifier 200 in accordance with this embodiment, since the signal light is not attenuated by optical attenuators, the pumping efficiency would not decrease, whereby the increase in noise factor and deterioration in optical amplification performances can be suppressed.

Third Embodiment

Figure 7:
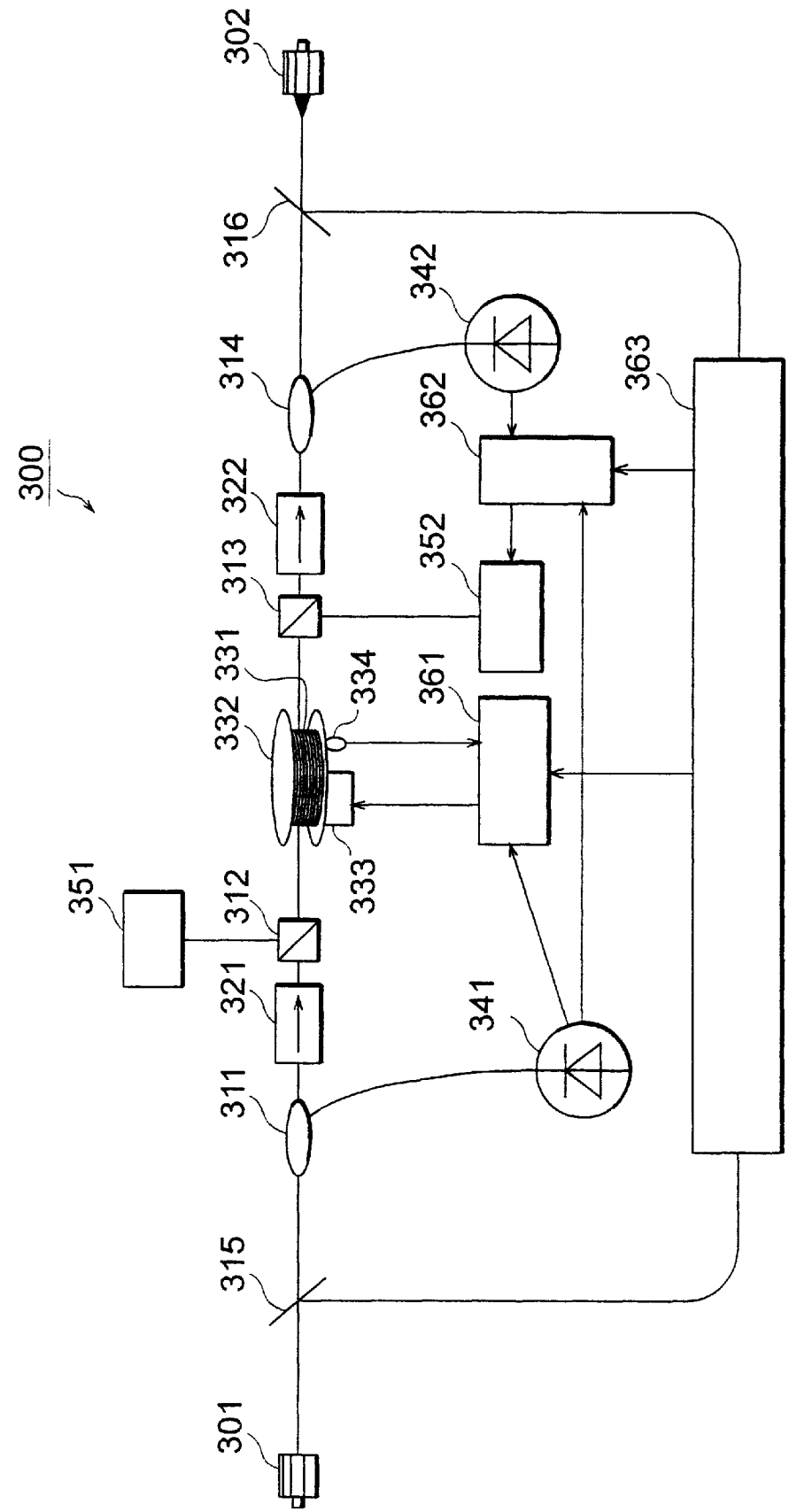
FIG. 7 is a configurational view of the optical amplifier in accordance with a third embodiment.

Next, the third embodiment of the optical amplifier and optical amplifier control method in accordance with the present invention will be explained. FIG. 7 is a configurational view of the optical amplifier 300 in accordance with the third embodiment. The optical amplifier 300 in accordance with this embodiment determines a gain of optical amplification in an amplification optical fiber according to the output signal light power in an optical amplifier in the previous stage and the input signal light power of the own optical amplifier, and controls the temperature of at least a part of the amplification optical fiber according to this gain.

In the optical amplifier 300 in accordance with this embodiment, from an input connector 301 to an output connector 302, an optical coupler 315, an optical coupler 311, an optical isolator 321, an optical coupler 312, an amplification optical fiber 331, an optical coupler 313, an optical isolator 322, an optical coupler 314, and an optical coupler 316 are successively cascaded to one another. Also, in the optical amplifier 300 in accordance with this embodiment, a light-receiving device 341 is connected to the optical coupler 311, an pumping light source 351 is connected to the optical coupler 312, an pumping light source 352 is connected to the optical coupler 313, and a light-receiving device 342 is connected to the optical coupler 314. Further, the optical amplifier 300 in accordance with this embodiment is equipped with a temperature control section 361, an output control section 362, and a monitor section 363.

The optical coupler 315 demultiplexes the light having arrived from the input connector 301, so as to output a predetermined wavelength of monitor light toward the monitor section 363, and output signal light toward the optical coupler 311. The optical coupler 311 causes a part of signal light having arrived from the optical coupler 315 to branch off toward the light-receiving device 341, and the remainder to pass therethrough to the optical isolator 321. The light-receiving device 341 is a photodiode, for example, receives the part of signal light branched out by the optical coupler 311, and outputs an electric signal indicative of the power of input signal light. The optical isolator 321 transmits therethrough light in the direction from the optical coupler 311 to the optical coupler 312, but not in the opposite direction. The optical coupler 312 outputs to the amplification optical fiber 331 the signal light having arrived from the optical isolator 321, and also outputs to the amplification optical fiber 331 the pumping light outputted from the pumping light source 351. The pumping light source 351 is a semiconductor laser light source, for example, and outputs pumping light with a wavelength which can excite a fluorescent material added to the amplification optical fiber 331.

The amplification optical fiber 331 is an optical waveguide whose core is doped with a fluorescent material excitable with the pumping light outputted from the pumping light sources 351, 352, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 331 is wound around a coil bobbin 332 made of a material (e.g., aluminum) which is excellent in thermal conductivity. Attached to the coil bobbin 332 are a Peltier device 333 for adjusting the temperature of the amplification optical fiber 331, and a thermistor 334 for detecting the temperature of the amplification optical fiber 331.

The optical coupler 313 outputs to the optical isolator 322 the signal light outputted from the amplification optical fiber 331, and outputs to the amplification optical fiber 331 the pumping light outputted from the pumping light source 352. The pumping light source 352 is a semiconductor laser light source, for example, and outputs pumping light with a wavelength which can excite the fluorescent material added to the amplification optical fiber 331. The optical isolator 322 transmits therethrough light in the direction from the optical coupler 313 to the optical coupler 314, but not in the opposite direction. The optical coupler 314 causes a part of signal light having arrived from the optical isolator 322 to branch off toward the light-receiving device 342, and the remainder to pass therethrough to the optical coupler 316. The light-receiving device 342 is a photodiode, for example, receives the part of signal light branched out by the optical coupler 314, and outputs an electric signal indicative of the power of output signal light. The optical coupler 316 multiplexes the signal light having arrived from the optical coupler 314 and the monitor light having arrived from the monitor section 363 together, and outputs thus multiplexed signal light and monitor light to the output connector 302.

The monitor section 363 inputs the monitor light having arrived from the optical coupler 315. The monitor light is the one outputted from the optical amplifier disposed in the previous stage of the optical amplifier 300 in accordance with this embodiment, and transmits information concerning the power of signal light outputted from this previous-stage optical amplifier. According to the information of this monitor light, the monitor section 363 senses the power $P_0$ (unit: mW) of the signal light outputted from the previous-stage optical amplifier, and notifies the result of sensing to each of the temperature control section 361 and output control section 362.

According to the output signal light power $P_0$ of the previous-stage optical amplifier sensed by the monitor section 363 and the input signal light power $P_1$ (unit: mW) detected by the light-receiving device 341, the temperature control section 361 determines a required gain G (unit: dB) from the following relational expression:

$$G = 10 \cdot \log(P_1/P_0). \quad (4)$$

Then, as with the second embodiment, according to the amount of change ΔG in the gain G, the temperature control section 361 controls the temperature of the amplification optical fiber 331 by way of the Peltier device 333, while monitoring the result of temperature measurement effected by the thermistor 334.

Also, according to the output signal light power $P_0$ of the previous-stage optical amplifier sensed by the monitor section 363 and the input signal light power $P_1$ detected by the light-receiving device 341, the output control section 362 controls the power of pumping light supplied to the amplification optical fiber 331 from the pumping light source 352, such that the power of output signal light detected by the light-receiving device 342 becomes a predetermined target value $P_2$ (unit: mW) represented by the following expression:

$$P_2 = (P_1/P_0) \cdot (P_0 + F). \quad (5)$$

Here, F (unit: mW) is a constant determined by noise characteristics of the optical amplifier 300, and is about 1 mw.

The optical amplifier 300 in accordance with this embodiment operates as follows. The pumping light outputted from the pumping light source 351 is forwardly supplied to the amplification optical fiber 331 by way of the optical coupler 312, whereas the pumping light outputted from the pumping light source 352 is reversely supplied to the amplification optical fiber 331 by way of the optical coupler 313. The signal light inputted to the input connector 301 successively travels through the optical coupler 315, the optical coupler 311, the optical isolator 321, and the optical coupler 312, so as to be inputted to and optically amplified in the amplification optical fiber 331. The signal light optically amplified in and outputted from the amplification optical fiber 331 successively travels through the optical coupler 313, the optical isolator 322, the optical coupler 314, and the optical coupler 316, so as to be outputted from the output connector 302.

Of the light inputted to the input connector 301, a specific wavelength of monitor light is demultiplexed by the optical coupler 315, so as to be inputted to the monitor section 363. According to the monitor light, the monitor section 363 acquires the power $P_0$ of signal light outputted from the previous-stage optical amplifier. A part of the signal light inputted to the input connector 301 is branched out by the optical coupler 311, so that the power $P_1$ is detected by the light-receiving device 341. On the other hand, a part of the signal light outputted from the output connector 302 is branched out by the optical coupler 314, so that its power is detected by the light-receiving device 342.

Then, according to the output signal light power $P_0$ of the previous-stage optical amplifier and the input signal light power $P_1$ of the own optical amplifier 300, the required gain G is determined by expression (4). Further, the temperature control section 361 calculates a gain of optical amplification in the amplification optical fiber 331 according to thus determined required gain, and the temperature of the amplification optical fiber 331 is controlled according to this gain by way of the Peltier device 333.

Also, according to the output signal light power $P_0$ of the previous-stage optical amplifier and the input signal light power $P_1$ of the own optical amplifier 300, the output control section 362 determines the target value $P_2$ of the power of output signal light from expression (5). Further, the output control section 362 controls the power of pumping light supplied to the amplification optical fiber 331 from the pumping light source 352, such that the power of output signal light detected by the light-receiving device 342 becomes the target value $P_2$.

The optical amplifier 300 in accordance with this embodiment not only has effects obtained by the one in accordance with the second embodiment, but also can keep the power of output signal light constant more accurately.

Fourth Embodiment

Figure 8:
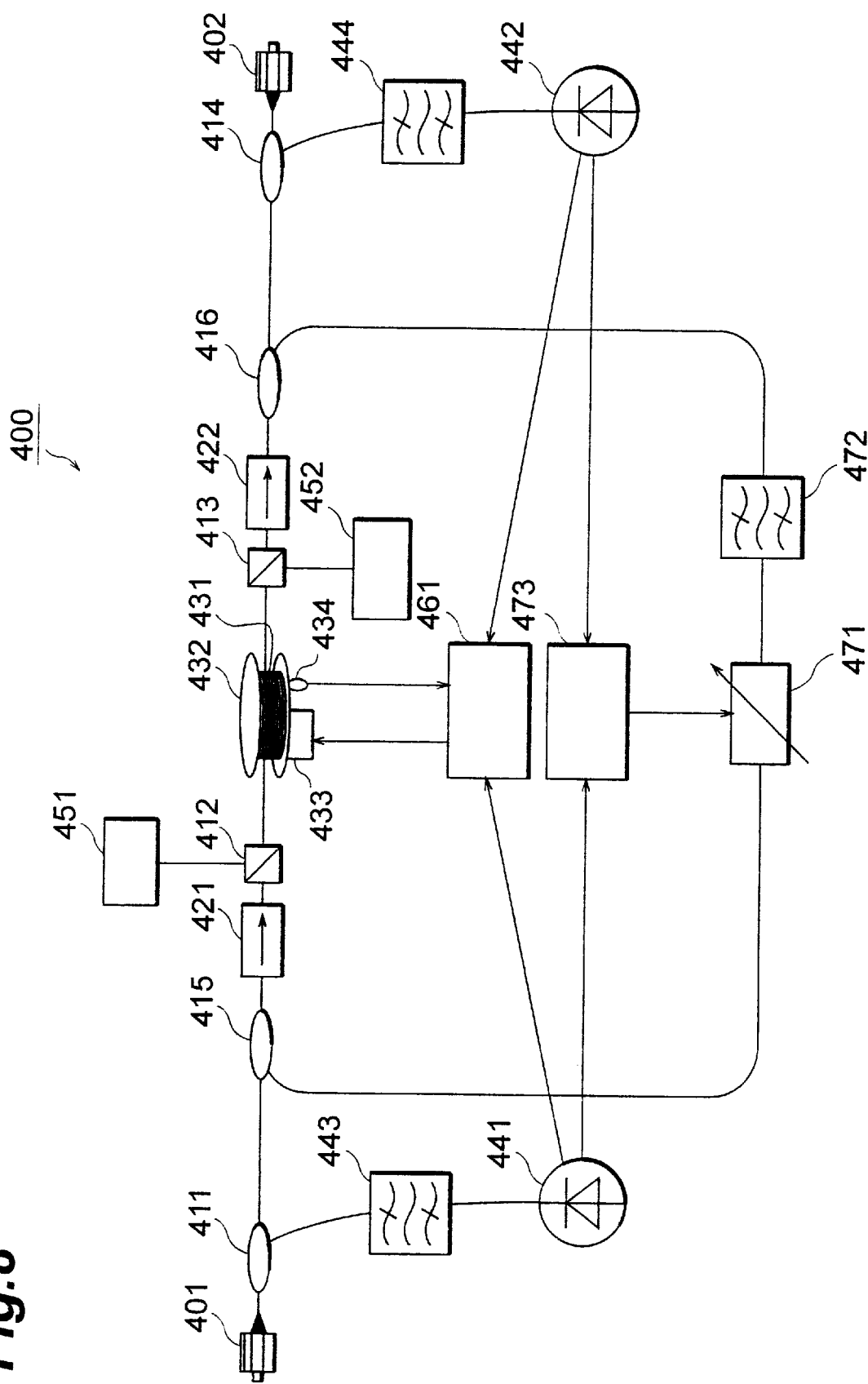
FIG. 8 is a configurational view of the optical amplifier in accordance with a fourth embodiment.

Next, the fourth embodiment of the optical amplifier and optical amplifier control method in accordance with the present invention will be explained. FIG. 8 is a configurational view of the optical amplifier 400 in accordance with the fourth embodiment. The optical amplifier 400 in accordance with this embodiment provides an optical feedback loop, so that the power of output signal light attains a predetermined target value, and controls the temperature of at least a part of an amplification optical fiber according to a gain of optical amplification in the amplification optical fiber.

In the optical amplifier 400 in accordance with this embodiment, from an input connector 401 to an output connector 402, an optical coupler 411, an optical coupler 415, an optical isolator 421, an optical coupler 412, an amplification optical fiber 431, an optical coupler 413, an optical isolator 422, an optical coupler 416, and an optical coupler 414 are successively cascaded to one another. Also, in the optical amplifier 400 in accordance with this embodiment, a light-receiving device 441 is connected to the optical coupler 411 by way of a band-pass filter 443, an pumping light source 451 is connected to the optical coupler 412, an pumping light source 452 is connected to the optical coupler 413, and a light-receiving device 442 is connected to the optical coupler 414 by way of a band-pass filter 444. Further, the optical amplifier 400 in accordance with this embodiment is equipped with a temperature control section 461, a variable optical attenuator 471, a band-pass filter 472, and a pilot light output control section 473.

The optical coupler 411 causes a part of signal light having arrived from the input connector 401 to branch off toward the band-pass filter 443, and the remainder to pass therethrough to the optical coupler 415. The light-receiving device 441 is a photodiode, for example, receives a part of a specific wavelength of the signal light branched out by the optical coupler 411 and passed through the band-pass filter 443, and outputs an electric signal indicative of the power of the specific wavelength of input signal light. The optical coupler 415 outputs to the optical isolator 421 the signal light having arrived from the optical coupler 411, and also outputs to the optical isolator 421 the light having arrived from the variable optical attenuator 471. The optical isolator 421 transmits therethrough light in the direction from the optical coupler 415 to the optical coupler 412, but not in the opposite direction. The optical coupler 412 outputs to the amplification optical fiber 431 the signal light having arrived from the optical isolator 421, and also outputs to the amplification optical fiber 431 the pumping light outputted from the pumping light source 451. The pumping light source 451 is a semiconductor laser light source, for example, and outputs pumping light with a wavelength which can excite a fluorescent material added to the amplification optical fiber 431.

The amplification optical fiber 431 is an optical waveguide whose core is doped with a fluorescent material excitable with the pumping light outputted from the pumping light sources 451, 452, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 431 is wound around a coil bobbin 432 made of a material (e.g., aluminum) which is excellent in thermal conductivity. Attached to the coil bobbin 432 are a Peltier device 433 for adjusting the temperature of the amplification optical fiber 431, and a thermistor 434 for detecting the temperature of the amplification optical fiber 431.

The optical coupler 413 outputs to the optical isolator 422 the signal light outputted from the amplification optical fiber 431, and outputs to the amplification optical fiber 431 the pumping light outputted from the pumping light source 452. The pumping light source 452 is a semiconductor laser light source, for example, and outputs pumping light with a wavelength which can excite the fluorescent material added to the amplification optical fiber 431. The optical isolator 422 transmits therethrough light in the direction from the optical coupler 413 to the optical coupler 416, but not in the opposite direction. The optical coupler 416 causes a part of light having arrived from the optical isolator 422 to branch off toward the band-pass filter 472, and the remainder to pass therethrough to the optical coupler 414. The optical coupler 414 causes a part of signal light having arrived from the optical coupler 416 to branch off toward the band-pass filter 444, and the remainder to pass therethrough to the output connector 402. The light-receiving device 442 is a photodiode, for example, receives a part of a specific wavelength of the signal light branched out by the optical coupler 414 and passed through the band-pass filter 444, and outputs an electric signal indicative of the power of the specific wavelength of input signal light. Here, the band-pass filters 443 and 444 have transmission characteristics identical to each other.

According to the respective powers of specific wavelength of input signal light detected by the light-receiving devices 441 and 442, the temperature control section 461 calculates a gain G (unit: dB) of optical amplification in the amplification optical fiber 431. Then, as with the second embodiment, according to the amount of change ΔG in the gain G, the temperature control section 461 controls the temperature of the amplification optical fiber 431 by way of the Peltier device 433, while monitoring the result of temperature measurement effected by the thermistor 434.

The band-pass filter 472 transmits therethrough, of the light having arrived from the optical coupler 416, a predetermined wavelength (e.g., 1603 nm) of light. The variable optical attenuator 471 inputs the predetermined wavelength of light transmitted through the band-pass filter 472, imparts an amount of attenuation L (unit: dB) thereto, and outputs the result to the optical coupler 415. As a consequence, the optical path from the optical coupler 415 to the optical coupler 416 by way of the amplification optical fiber 431, and the returning path from the optical coupler 416 to the optical coupler 415 byway of the band-pass filter 472 and variable optical attenuator 471 constitute an optical feedback loop for laser-oscillating the predetermined wavelength of light transmitted through the band-pass filter 472.

According to the respective powers of specific wavelength of signal light detected by the light-receiving devices 441 and 442, the pilot light output control section 473 calculates the gain G of optical amplification in the amplification optical fiber 431. Also, the pilot light output control section 473 stores beforehand therein the total loss $L_0$ (unit: dB) of the optical couplers 412, 413, 415, and 416 and the optical isolators 421 and 422. Then, the pilot light output control section 473 sets the attenuation amount L of the variable optical attenuator 471 to the value calculated by the following expression:

$$L = G - L_0. \tag{6}$$

The optical amplifier 400 in accordance with this embodiment operates as follows. The pumping light outputted from the pumping light source 451 is forwardly supplied to the amplification optical fiber 431 by way of the optical coupler 412, whereas the pumping light outputted from the pumping light source 452 is reversely supplied to the amplification optical fiber 431 by way of the optical coupler 413. The signal light inputted to the input connector 401 successively travels through the optical coupler 411, the optical coupler 415, the optical isolator 421, and the optical coupler 412, so as to be inputted to and optically amplified in the amplification optical fiber 431. The signal light optically amplified in and outputted from the amplification optical fiber 431 successively travels through the optical coupler 413, the optical isolator 422, the optical coupler 416, and the optical coupler 414, so as to be outputted from the output connector 402.

A part of the signal light inputted to the input connector 401 is branched out by the optical coupler 411, and a specific wavelength component thereof passes through the band-pass filter 443, so that its power is detected by the light-receiving device 441. On the other hand, a part of the signal light outputted from the output connector 402 is branched out by the optical coupler 414, and a specific wavelength component thereof passes through the band-pass filter 444, so that its power is detected by the light-receiving device 442. Then, according to the respective powers of the specific wavelength of signal light detected by the light-receiving device 441 and light-receiving device 442, the temperature control section 461 calculates a gain of optical amplification in the amplification optical fiber 431, and the temperature of the amplification optical fiber 431 is controlled according to this gain by way of the Peltier device 433.

Also, according to the respective powers of specific wavelength of signal light detected by the light-receiving devices 441 and 442, the pilot optical output control section 473 calculates the gain G of optical amplification in the amplification optical fiber 431, and the attenuation amount L of the variable optical attenuator 471 is calculated from expression (6). The variable optical attenuator 471 is set to the attenuation amount L by the pilot light output control section 473.

In this embodiment, due to the action of the above-mentioned optical feedback loop, the power of signal light outputted from the output connector 402 is kept constant. Therefore, the power of pumping light supplied to the amplification optical fiber 431 from the pumping light sources 451, 452 may be left constant.

The optical amplifier 400 in accordance with this embodiment not only has effects obtained by the one in accordance with the second embodiment, but also can keep the power of output signal light constant more accurately.

Fifth Embodiment

Figure 9:
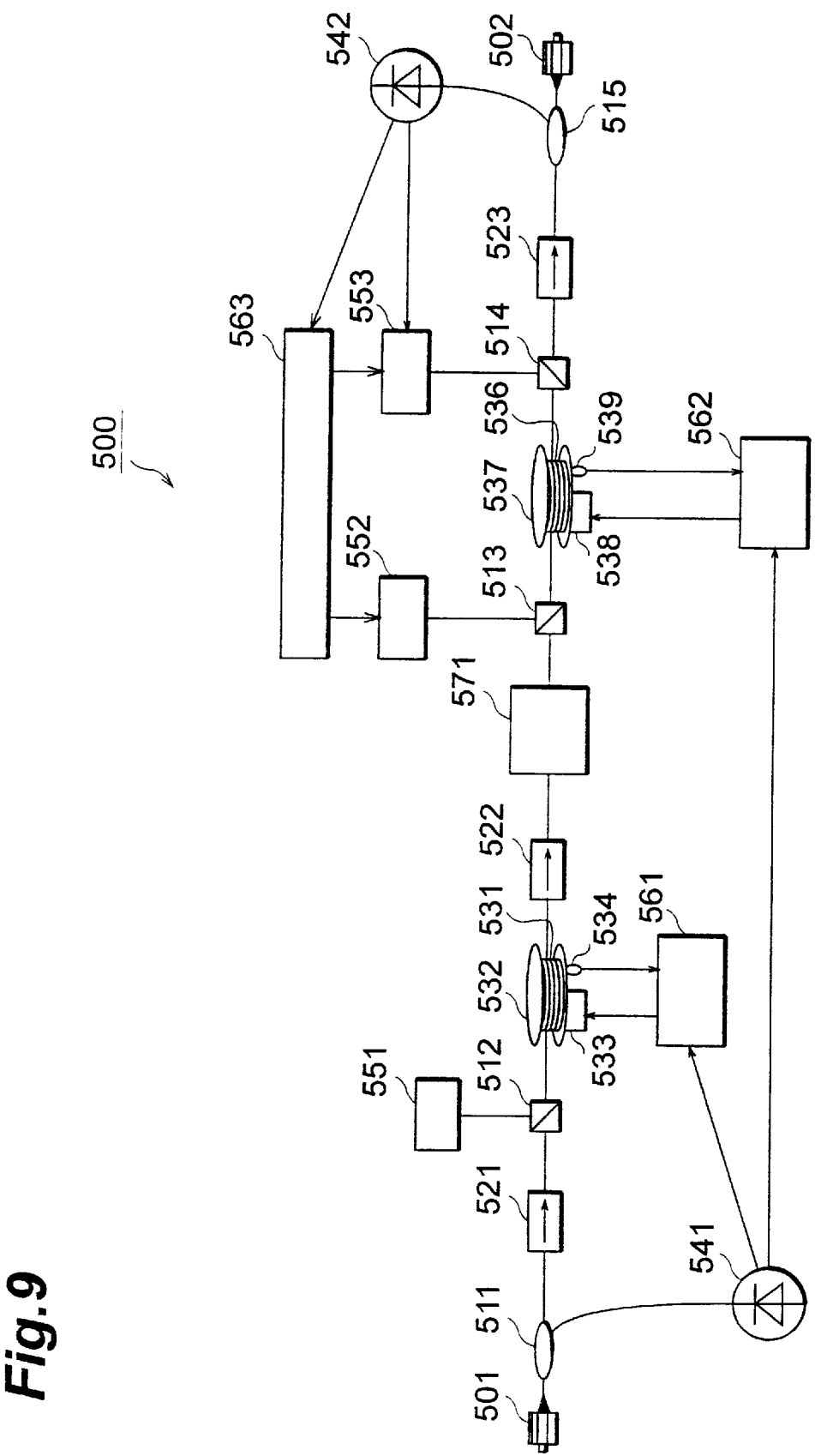
FIG. 9 is a configurational view of the optical amplifier in accordance with a fifth embodiment.

Next, the fifth embodiment of the optical amplifier and optical amplifier control method in accordance with the present invention will be explained. FIG. 9 is a configurational view of the optical amplifier 500 in accordance with the fifth embodiment. In the optical amplifier 500 in accordance with this embodiment, the amplification optical fiber has a two-stage configuration, and signal light in the wavelength range of C band is optically amplified.

In the optical amplifier 500 in accordance with this embodiment, from an input connector 501 to an output connector 502, an optical coupler 511, an optical isolator 521, an optical coupler 512, an amplification optical fiber 531, an optical isolator 522, a gain equalizer 571, an optical coupler 513, an amplification optical fiber 536, an optical coupler 514, an optical isolator 523, and an optical coupler 515 are successively cascaded to one another. Also, in the optical amplifier 500 in accordance with this embodiment, a light-receiving device 541 is connected to the optical coupler 511, an pumping light source 551 is connected to the optical coupler 512, an pumping light source 552 is connected to the optical coupler 513, an pumping light source 553 is connected to the optical coupler 514, and a light-receiving device 542 is connected to the optical coupler 515. Further, the optical amplifier 500 in accordance with this embodiment is equipped with temperature control sections 561 and 562 and an output control section 563.

The optical coupler 511 causes a part of signal light having arrived from the input connector 501 to branch off toward the light-receiving device 541, and the remainder to pass therethrough to the optical isolator 521. The light-receiving device 541 is a photodiode, for example, receives the part of signal light branched out by the optical coupler 511, and outputs an electric signal indicative of the power of input signal light. The optical isolator 521 transmits therethrough light in the direction from the optical coupler 511 to the optical coupler 512, but not in the opposite direction. The optical coupler 512 outputs to the amplification optical fiber 531 the signal light having arrived from the optical isolator 521, and also outputs to the amplification optical fiber 531 the pumping light outputted from the pumping light source 551. The pumping light source 551 is a semiconductor laser light source, for example, and outputs pumping light with a wavelength which can excite a fluorescent material added to the amplification optical fiber 531.

The amplification optical fiber 531 is an optical waveguide whose core is doped with a fluorescent material excitable with the pumping light outputted from the pumping light source 551, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 531 is wound around a coil bobbin 532 made of a material (e.g., aluminum) which is excellent in thermal conductivity. Attached to the coil bobbin 532 are a Peltier device 533 for adjusting the temperature of the amplification optical fiber 531, and a thermistor 534 for detecting the temperature of the amplification optical fiber 531.

The optical isolator 522 transmits therethrough light in the direction from the amplification optical fiber 531 to the gain equalizer 571, but not in the opposite direction. The gain equalizer 571 has a loss spectrum which compensates for the deviation in gain of signal light in the amplification optical fibers 531 and 536, thereby flattening the total gain of the optical amplifier 500. The optical coupler 513 outputs to the amplification optical fiber 536 the signal light having arrived from the gain equalizer 571, and also outputs to the amplification optical fiber 536 the pumping light outputted from the pumping light source 552. The pumping light source 552 is a semiconductor laser light source, for example, and outputs pumping light with a wavelength which can excite a fluorescent material added to the amplification optical fiber 536.

The amplification optical fiber 536 is an optical waveguide whose core is doped with a fluorescent material excitable with the pumping light outputted from the pumping light sources 552, 553, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 536 is wound around a coil bobbin 537 made of a material (e.g., aluminum) which is excellent in thermal conductivity. Attached to the coil bobbin 537 are a Peltier device 538 for adjusting the temperature of the amplification optical fiber 536, and a thermistor 539 for detecting the temperature of the amplification optical fiber 536.

The optical coupler 514 outputs to the optical isolator 523 the signal light outputted from the amplification optical fiber 536, and outputs to the amplification optical fiber 536 the pumping light outputted from the pumping light source 553. The pumping light source 553 is a semiconductor laser light source, for example, and outputs pumping light with a wavelength which can excite the fluorescent material added to the amplification optical fiber 536. The optical isolator 523 transmits therethrough light in the direction from the optical coupler 514 to the optical coupler 515, but not in the opposite direction. The optical coupler 515 causes a part of signal light having arrived from the optical isolator 523 to branch off toward the light-receiving device 542, and the remainder to pass therethrough to the output connector 502. The light-receiving device 542 is a photodiode, for example, receives the part of signal light branched out by the optical coupler 515, and outputs an electric signal indicative of the power of output signal light.

According to the power of input signal light detected by the light-receiving device 541, the temperature control section 561 controls the temperature of the amplification optical fiber 531 by way of the Peltier device 533, while monitoring the result of temperature measurement effected by the thermistor 534. Also, according to the power of input signal light detected by the light-receiving device 541, the temperature control section 562 controls the temperature of the amplification optical fiber 536 by way of the Peltier device 538, while monitoring the result of temperature measurement effected by the thermistor 539. On the other hand, the output control section 563 controls the power of pumping light supplied to the amplification optical fiber 536 from the pumping light sources 552, 553, such that the power of output signal light detected by the light-receiving device 542 becomes a predetermined target value.

The optical amplifier 500 in accordance with this embodiment operates as follows. The pumping light outputted from the pumping light source 551 is forwardly supplied to the front-stage amplification optical fiber 531 by way of the optical coupler 512. On the other hand, the pumping light outputted from the pumping light source 552 is forwardly supplied to the rear-stage amplification optical fiber 536 by way of the optical coupler 513, whereas the pumping light outputted from the pumping light source 553 is reversely supplied to the rear-stage amplification optical fiber 536 by way of the optical coupler 514.

The signal light inputted to the input connector 501 successively travels through the optical coupler 511, the optical isolator 521, and the optical coupler 512, so as to be inputted to and optically amplified in the amplification optical fiber 531. The signal light optically amplified in and outputted from the amplification optical fiber 531 is inputted to the gain equalizer 571 by way of the optical isolator 522, so as to incur the loss depending on the wavelength according to the loss spectrum of the gain equalizer 571. The signal light outputted from the gain equalizer 571 is inputted to the amplification optical fiber 536 by way of the optical coupler 513, so as to be optically amplified in the amplification optical fiber 536. The signal light optically amplified in and outputted from the amplification optical fiber 536 successively travels through the optical coupler 514, the optical isolator 523, and the optical coupler 515, so as to be outputted from the output connector 502.

A part of the signal light inputted to the input connector 501 is branched out by the optical coupler 511, so that its power is detected by the light-receiving device 541. According to the power of the input signal light detected by the light-receiving device 541, the temperature of the front-stage amplification optical fiber 531 is controlled by the temperature control section 561 by way of the Peltier device 533, and the temperature of the rear-stage amplification optical fiber 536 is controlled by the temperature control section 566 by way of the Peltier device 538.

On the other hand, a part of the signal light outputted from the output connector 502 is branched out by the optical coupler 515, so that its power is detected by the light-receiving device 542. Also, the power of the pumping light supplied to the rear-stage amplification optical fiber 536 by the pumping light sources 552, 553 is controlled by the output control section 562 so that the power of output signal light detected by the light-receiving device 542 becomes a predetermined target value.

More specifically, the optical amplifier 500 in accordance with this embodiment is constituted as follows. Each of the amplification optical fibers 531 and 536 is a silica type optical fiber whose core is doped with Er element and Al element, having an Er element doping concentration of 1000 wt.ppm, a cutoff wavelength of 1.1 $\mu$m, and an absorption of about 7.6 dB/m at a wavelength of 1.53 $\mu$m. The length of the front-stage amplification optical fiber 531 is 5 m, whereas the length of the rear-stage optical fiber 536 is 12 m.

The pumping light source 551 for forwardly supplying pumping light to the front-stage amplification optical fiber 531 is a semiconductor laser light source which outputs laser light having a wavelength of 0.98 $\mu$m, thereby supplying pumping light having a power of 65 mW to the amplification optical fiber 531. The pumping light sources 552 and 553 for forwardly and reversely supplying pumping light to the rear-stage amplification optical fiber 536 respectively are semiconductor laser light sources which output laser light having a wavelength of 1.48 $\mu$m, and the pumping light supplied to the amplification optical fiber 536 is controlled by the output control section 563 so that the output signal light power detected by the light-receiving device 542 becomes a predetermined target value.

Figure 10:
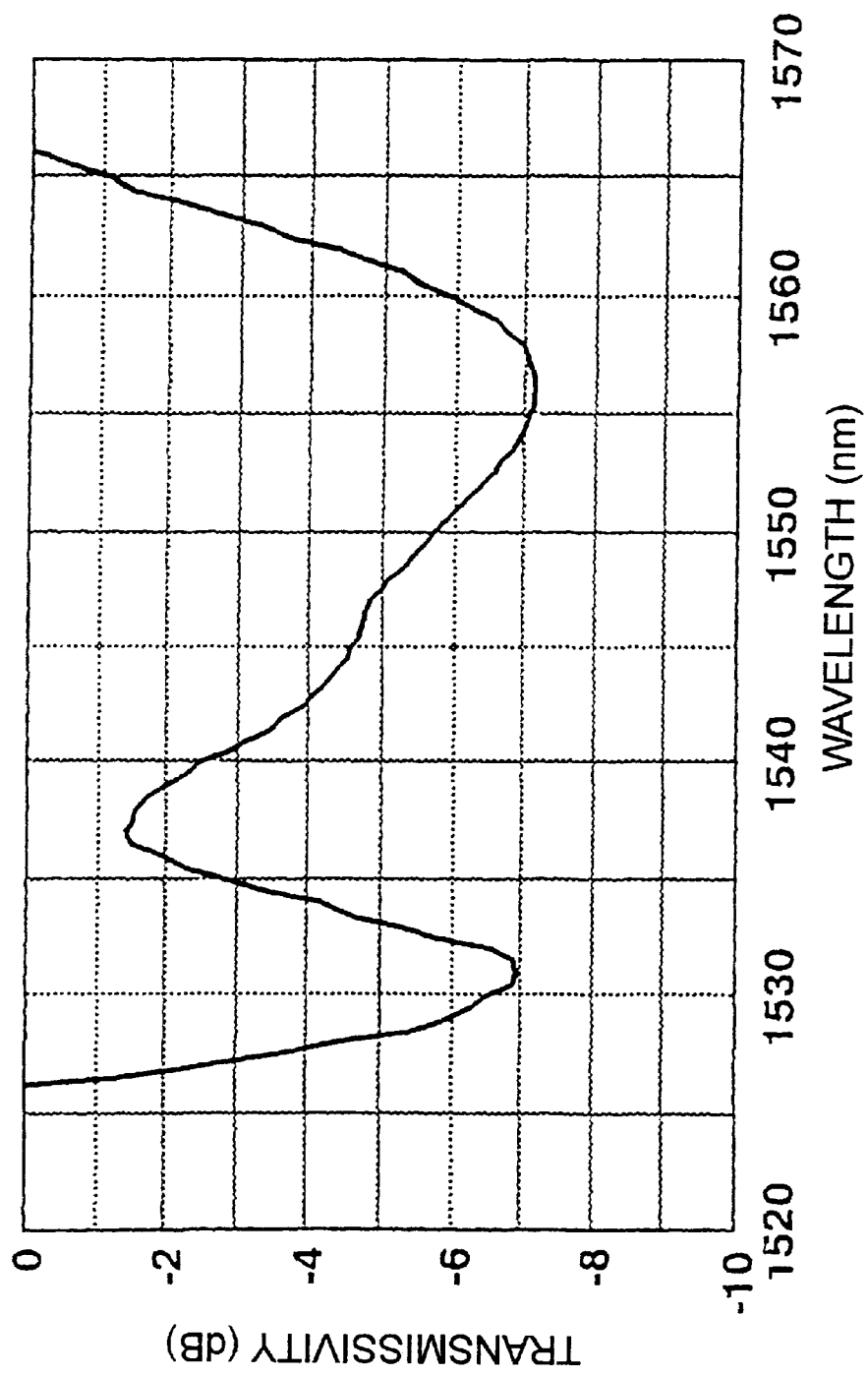
FIG. 10 is a graph showing a loss spectrum of the gain equalizer in the optical amplifier in accordance with the fifth embodiment.

The gain equalizer 571 disposed between the front-stage amplification optical fiber 531 and the rear-stage amplification optical fiber 536 is assumed to have a loss spectrum having the form shown in FIG. 10. As shown in this graph, within the range of the wavelength band of 1537 to 1559 nm, the loss is the lowest in the vicinity of the wavelength of 1537 nm.

Let signal lights having plurality of wavelengths within the wavelength range of C band, i.e., 1537 to 1559 nm, be inputted to the input connector 501, the powers of the respective wavelengths of the signal lights fluctuatein the same manner, and the total of the powers fluctuate within the range of −9.0 to −7.5 dBm. Let the temperature of the amplification optical fibers 531 and 536 be 25° C. when the total of the powers of the input signal lights is −7.5 dBm, which is defined as a reference state.

Then, when the total of the powers of the input signal lights is increased by ΔP (unit: dB) from the reference state due to the temperature control carried out by the temperature control sections 561, 562 according to the result of detection of the input signal light power effected by the light-receiving device 541, the temperature of the amplification optical fibers 531, 536 is raised by the temperature difference ΔT (unit: K) represented by the above-mentioned expression (1). Here, G (unit: dB) is a set center value of a range for adjusting net gain in the amplification optical fibers 531 and 536, which is the value of gain of optical amplification in the amplification optical fibers 531 and 536 at a temperature of 25° C., i.e., 34 dB, in this case. Also, A (unit: 1/K) is a constant determined by the compositions of the amplification optical fibers 531 and 536 and the signal light wavelength band, which is at a value of −9×10⁻⁴/K in this case. Here, when the total of the powers of the input signal lights is −9.0 dBm, the temperature of the amplification optical fibers 531 and 536 is set to 75° C.

Figure 11:
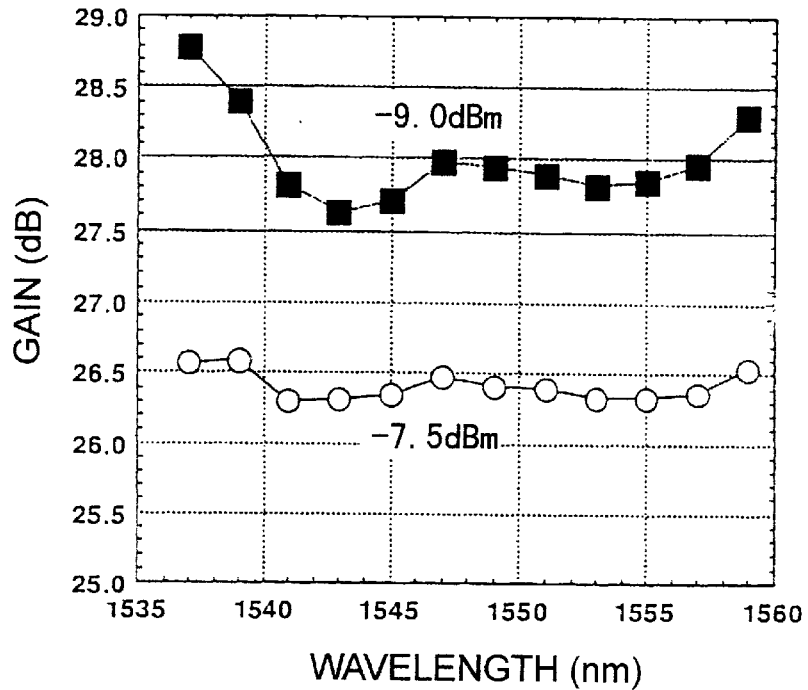
FIG. 11 is a graph showing gain spectra from an amplification optical fiber 531 to an amplification optical fiber 536 in the optical amplifier in accordance with the fifth embodiment for respective values of input signal light power.
Figure 12:
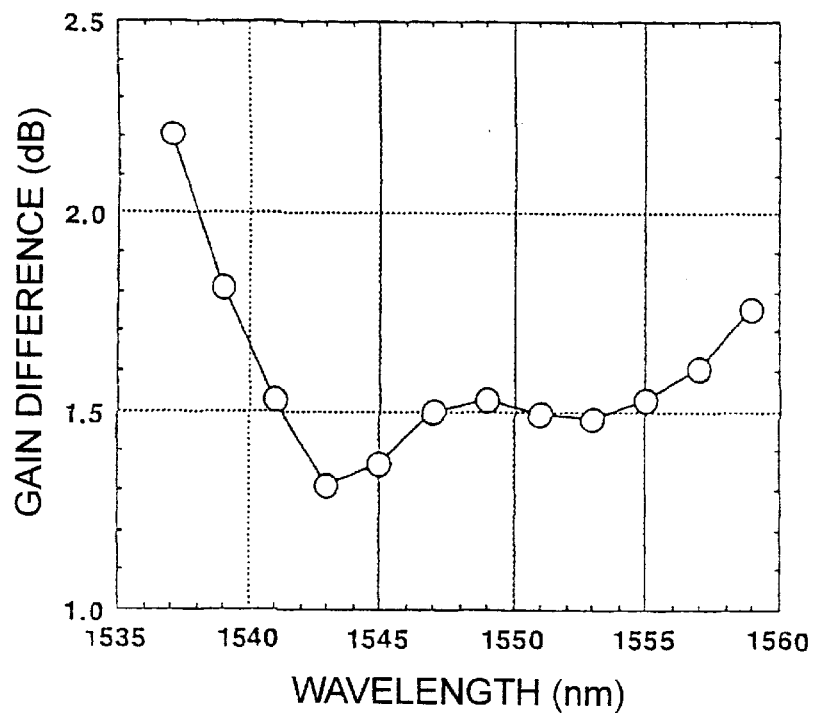
FIG. 12 is a graph showing changes in gain of the optical amplifier in accordance with the fifth embodiment for respective values of input signal light power with reference to the gain obtained when the total of the powers of the input signal lights is −7.5 dBm (at a temperature of 25° C.)

FIG. 11 is a graph showing gain spectra from the amplification optical fiber 531 to amplification optical fiber 536 in the optical amplifier 500 in accordance with the fifth embodiment for respective values of input signal light power. FIG. 12 is a graph showing changes in gain of the optical amplifier 500 in accordance with the fifth embodiment for respective values of input signal light power with reference to the gain obtained when the total of the powers of input signal lights is −7.5 dBm (at a temperature of 25° C.). As can be seen from these graphs, with reference to the case where the input signal light power is −7.5 dBm (at a temperature of 25° C.), the gain changes by about +1.5 dB when the input signal light power changes by −1.5 dB (−9.0 dBm, at a temperature of 75° C.).

As a consequence, in the optical amplifier 500 in accordance with this embodiment, even when the power of input signal light fluctuates, the power of output signal light attains a predetermined target value, and the form of gain spectrum is kept constant. In particular, the fluctuation in output power of individual wavelengths of signal light is within ±0.1 dB within the wavelength band of 1547 to 1555 nm. When signal light within the wavelength band of 1547 to 1555 nm is used, even if the power of input signal light fluctuates within the range of −9 to −7.5 dBm, the optical amplifier 500 in accordance with this embodiment keeps the powers of individual wavelengths of output signal light constant, while maintaining a flatness in gain.

Sixth Embodiment

Figure 13:
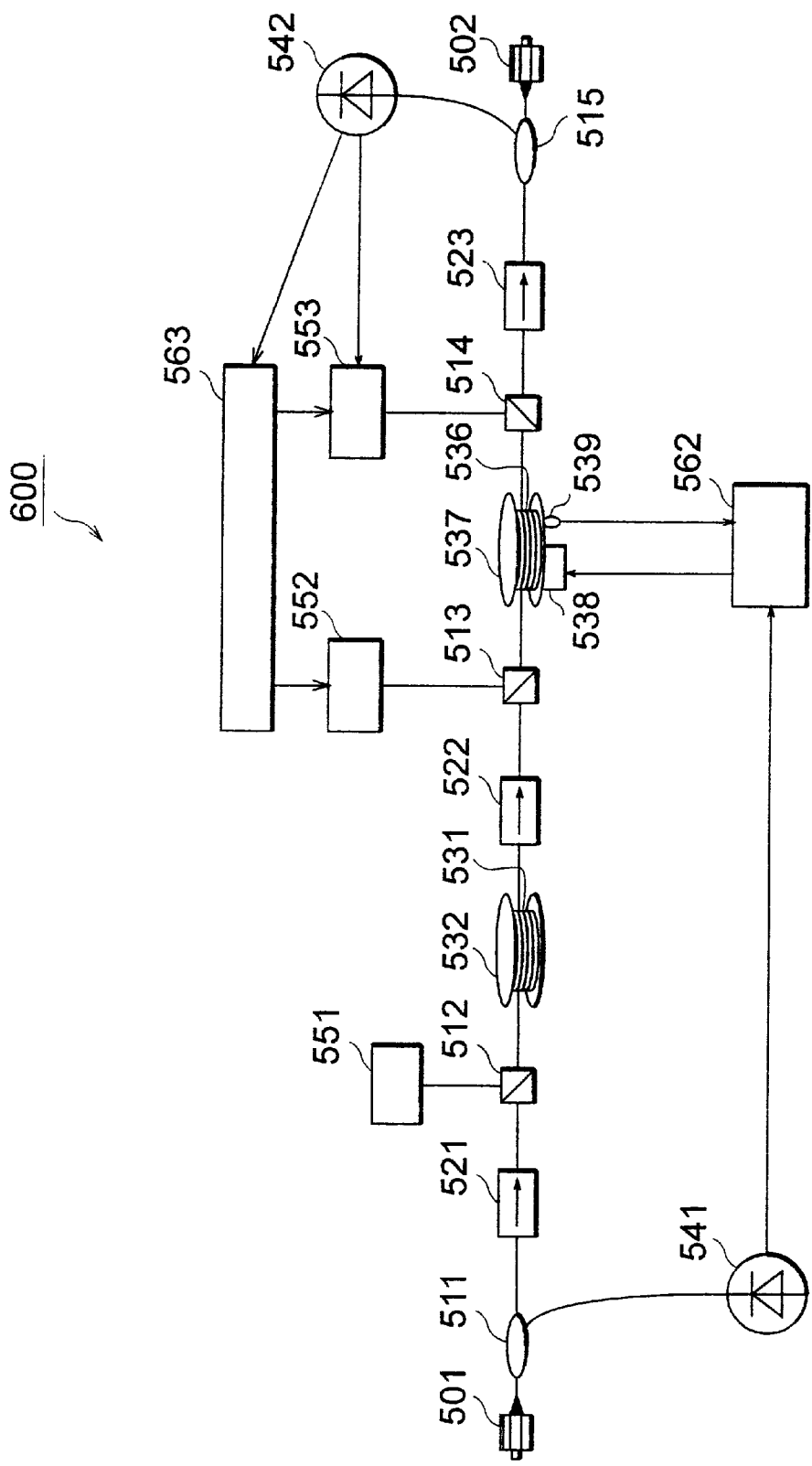
FIG. 13 is a configurational view of the optical amplifier in accordance with a sixth embodiment.

Next, the sixth embodiment of the optical amplifier and optical amplifier control method in accordance with the present invention will be explained. FIG. 13 is a configurational view of the optical amplifier 600 in accordance with the sixth embodiment. In the optical amplifier 600 in accordance with this embodiment, the amplification optical fiber has a two-stage configuration, and only the temperature of the rear-stage amplification optical fiber is controlled, so as to improve the noise factor.

The optical amplifier 600 in accordance with the sixth embodiment has a configuration identical to that of the optical amplifier 500 in accordance with the fifth embodiment except that the Peltier device 533, the thermistor 534, the temperature control section 561, and the gain equalizer 571 are eliminated therefrom. In the optical amplifier 600 in accordance with this embodiment, the front-stage amplification optical fiber 531 is set to room temperature.

More specifically, the optical amplifier 600 in accordance with this embodiment is constituted as follows. Each of the amplification optical fibers 531 and 536 is a silica type optical fiber whose core is doped with Er element and Al element, having an Er element doping concentration of 3700 wt.ppm, a cutoff wavelength of 1.1 μm, and an absorption of about 50 dB/m at a wavelength of 1.53 μm. The length of the front-stage amplification optical fiber 531 is 4.6 m, whereas the length of the rear-stage optical fiber 536 is 15 m.

The pumping light source 551 for forwardly supplying pumping light to the front-stage amplification optical fiber 531 is a semiconductor laser light source which outputs laser light having a wavelength of 0.98 μm, thereby supplying pumping light having a power of 40 mW to the amplification optical fiber 531. The pumping light sources 552 and 553 for forwardly and reversely supplying pumping light to the rear-stage amplification optical fiber 536 respectively are semiconductor laser light sources which output laser light having a wavelength of 1.48 μm, and the pumping light supplied to the amplification optical fiber 536 is controlled by the output control section 563 so that the output signal light power detected by the light-receiving device 542 becomes a predetermined target value.

Let signal lights having a plurality of wavelengths within the wavelength range of L band, i.e., 1574 to 1601 nm, be inputted to the input connector 501, the powers of the respective wavelengths of the signal lights fluctuate in the same manner, and the total of the powers fluctuate within the range of −16.5 to −12.5 dBm. Let the temperature of the amplification optical fiber 536 be 30° C. when the total of the powers of input signal lights is −14.5 dBm, which is defined as a reference state.

Then, when the total of the powers of input signal lights is increased by ΔP (unit: dB) from the reference state due to the temperature control carried out by the temperature control section 562 according to the result of detection of the input signal light power effected by the light-receiving device 541, the temperature of the amplification optical fiber 536 is raised by the temperature difference ΔT (unit: K) represented by the above-mentioned expression (1). Here, G (unit: dB) is a set center value of a range for adjusting net gain in the rear-stage amplification optical fiber 536, which is the value of gain of optical amplification in the rear-stage amplification optical fiber 536 at a temperature of 30° C., i.e., 26 dB, in this case. Also, A (unit: 1/K) is a constant determined by the composition of the amplification optical fiber 536 and the signal light wavelength band, which is at a value of $2.6 \times 10^{-3}$/K in this case. Here, the front-stage amplification optical fiber 531 is maintained at room temperature (25° C.).

Here, when the total of the powers of input signal lights is −16.5 dBm, the temperature of the amplification optical fiber 536 is set to 0° C. When the total of the powers of the input signal lights is −15.17 dBm, the temperature of the amplification optical fiber 536 is set to 20° C. When the total of the powers of the input signal lights is −14.5 dBm, the temperature of the amplification optical fiber 536 is set to 30° C. When the total of the powers of the input signal lights is −13.83 dBm, the temperature of the amplification optical fiber 536 is set to 40° C. When the total of the powers of the input signal lights is −12.5 dBm, the temperature of the amplification optical fiber 536 is set to 60° C.

Figure 14:
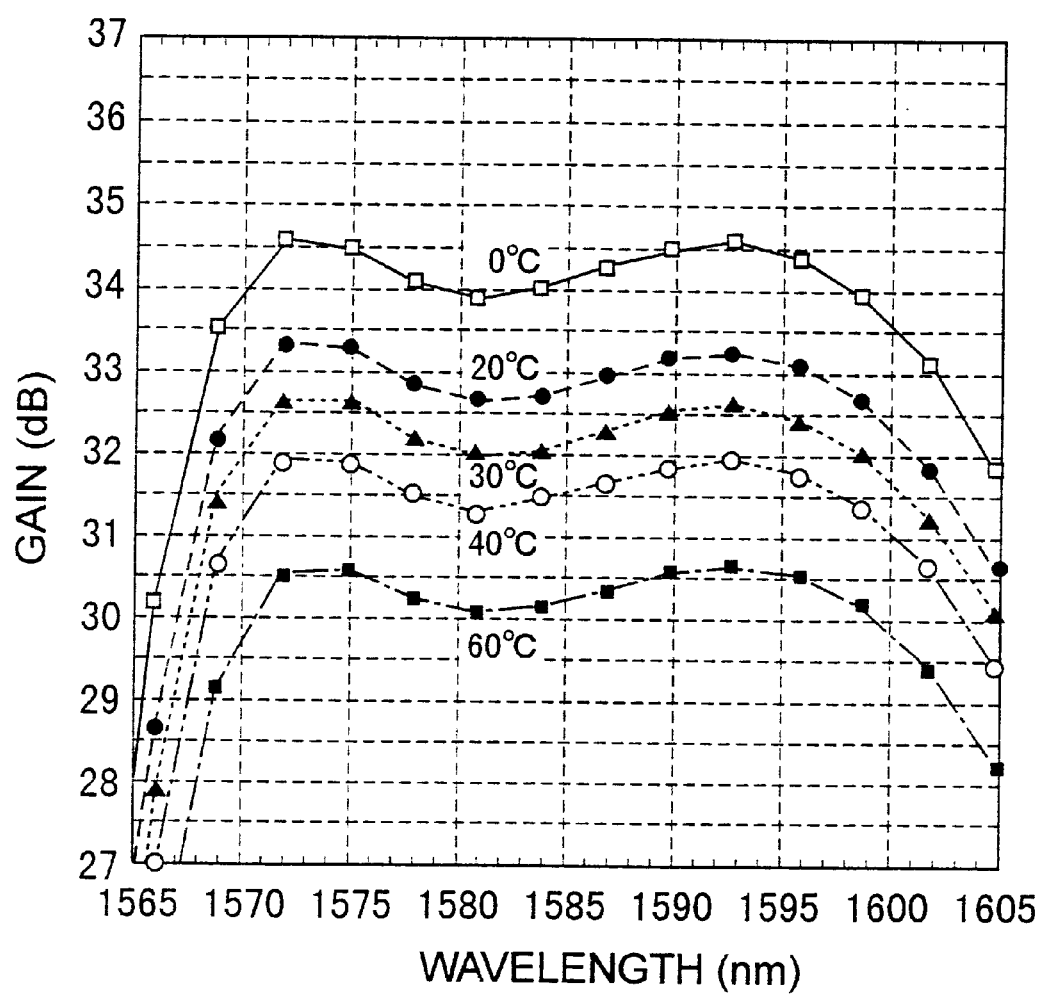
FIG. 14 is a graph showing gain spectra from an amplification optical fiber 531 to an amplification optical fiber 536 in the optical amplifier in accordance with the sixth embodiment for respective values of input signal light power.

FIG. 14 is a graph showing gain spectra from an amplification optical fiber 531 to an amplification optical fiber 536 in the optical amplifier 600 in accordance with the sixth embodiment for respective values of input signal light power. As can be seen from this graph, with reference to the case where the input signal light power is −14.5 dBm (at a temperature of 30° C.), the gain changes by about +2 dB when the input signal light power changes by −2 dB (−16.5 dBm, at a temperature of 0° C.), the gain changes by about +0.67 dB when the input signal light power changes by −0.67 dB (−15.17 dBm, at a temperature of 20° C.), the gain changes by about −0.67 dB when the input signal light power changes by +0.67 dB (−13.83 dBm, at a temperature of 40° C.), and the gain changes by about −2 dB when the input signal light power changes by +2 dB (−12.5 dBm, at a temperature of 60° C.). As a consequence, in the optical amplifier 600 in accordance with this embodiment, even when the power of input signal light fluctuates, the power of output signal light attains a predetermined target value, and the form of gain spectrum is kept constant.

Figure 15:
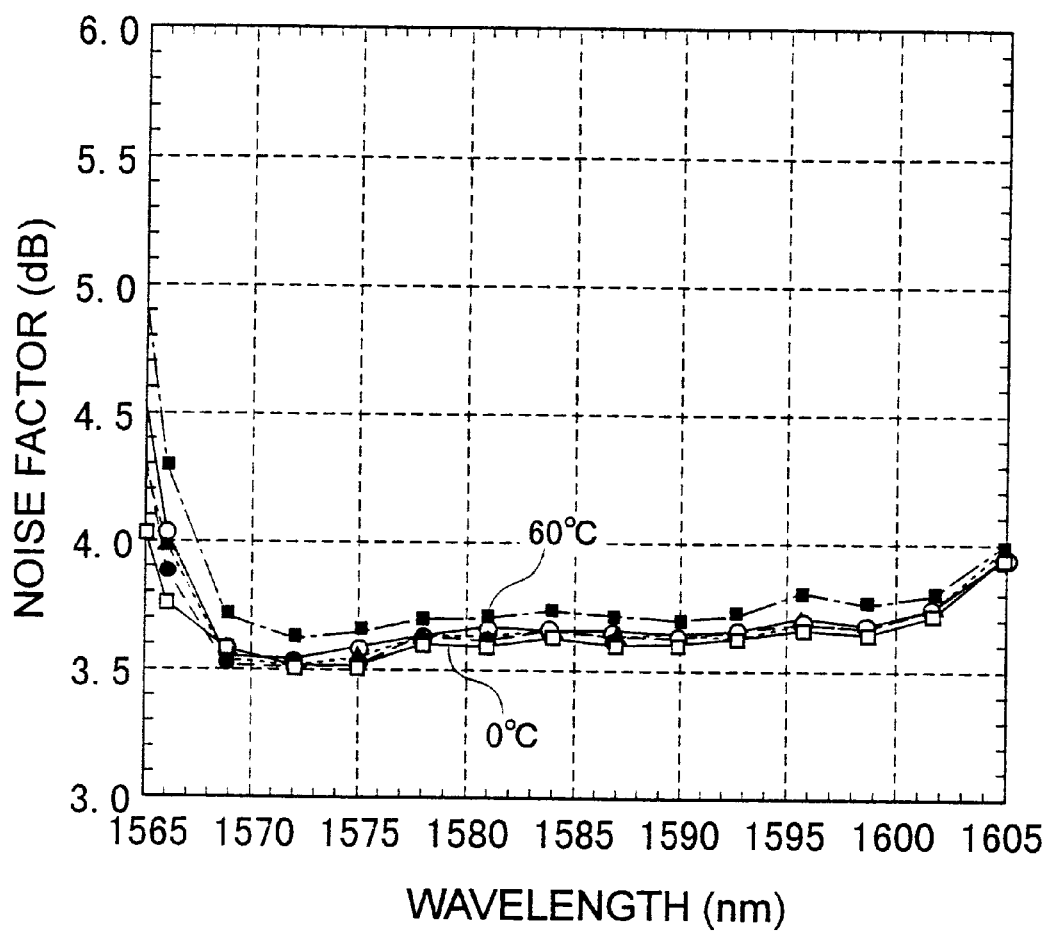
FIG. 15 is a graph showing wavelength dependence characteristics of noise factor measured immediately in front of the amplification optical fiber 531 in the optical amplifier in accordance with the sixth embodiment for respective values of input signal light power.

FIG. 15 is a graph showing wavelength dependence characteristics of noise factor measured immediately in front of the amplification optical fiber 531 in the optical amplifier 600 in accordance with the sixth embodiment for respective values of input signal light power. As can be seen from this graph, since the signal light is not attenuated by optical attenuators or gain equalizers, the increase in noise factor and the deterioration in optical amplification performances can be suppressed without lowering the pumping efficiency. As compared with the case of the first embodiment (FIG. 4), while the noise factor deteriorates in the first embodiment as the temperature of the amplification optical fiber is raised, the deterioration in noise factor is small in the sixth embodiment even when the temperature of the amplification optical fiber 536 is raised.

Here, with the temperature of the front-stage amplification optical fiber 531 being set to room temperature, controlling the temperature of the rear-stage amplification optical fiber 536 according to the input signal light power would improve the noise factor. On the other hand, controlling the respective temperatures of the front-stage amplification optical fiber 531 and the rear-stage amplification optical fiber 536 according to the input signal light power can respond to a wider fluctuation in input signal light power. Either of these options can be chosen depending on the purpose of the optical amplifier.

Seventh Embodiment

Figure 16:
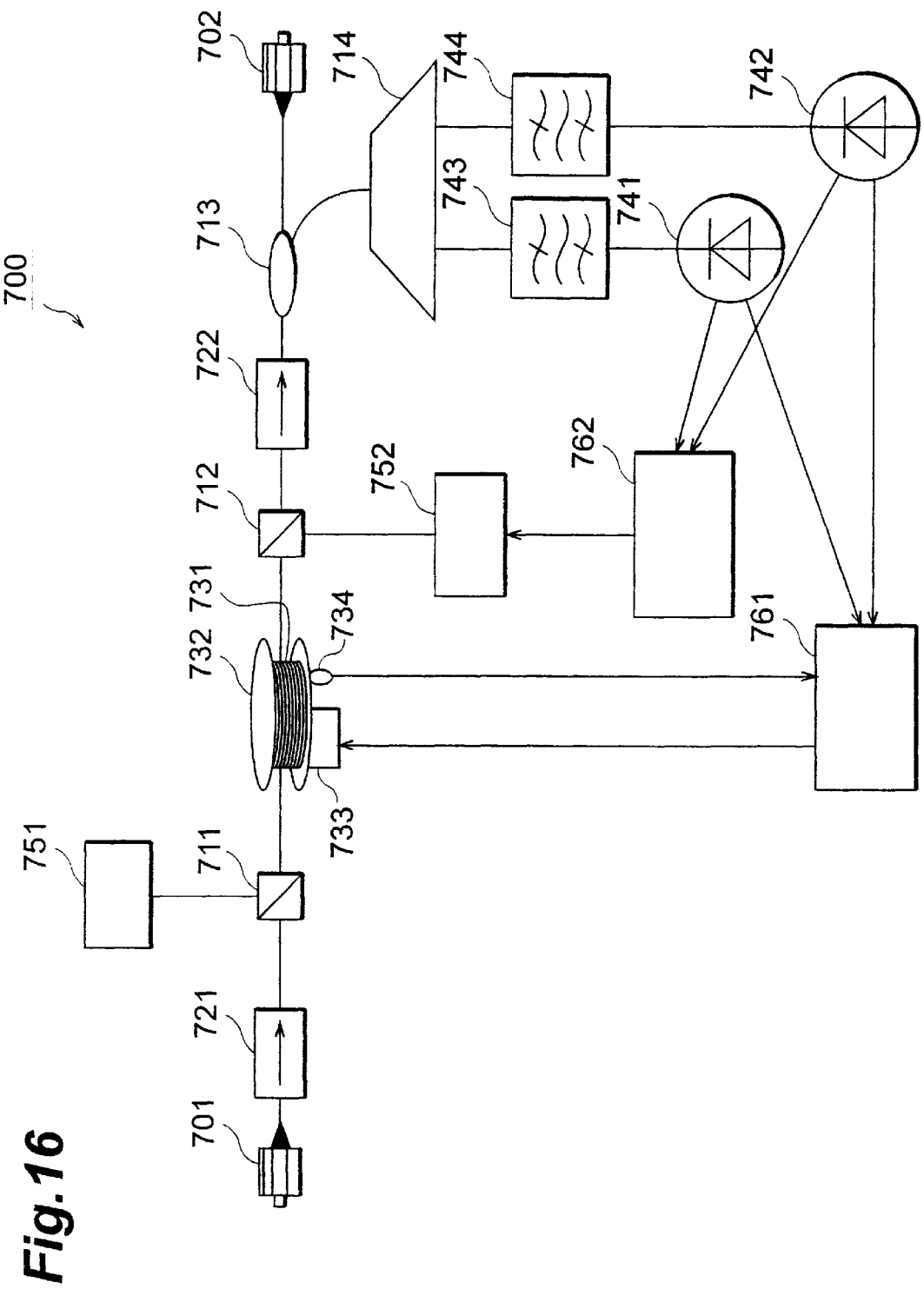
FIG. 16 is a configurational view of the optical amplifier in accordance with a seventh embodiment.

Next, the seventh embodiment of the optical amplifier and optical amplifier control method in accordance with the present invention will be explained. FIG. 16 is a configurational view of the optical amplifier 700 in accordance with the seventh embodiment. The optical amplifier 700 in accordance with this embodiment feedback-controls the temperature of the amplification optical amplifier according to the difference between outputted two wavelengths of signal light, instead of the feed-forward control of the amplification optical fiber as in the case of the first to sixth embodiments.

In the optical amplifier 700 in accordance with this embodiment, from an input connector 701 to an output connector 702, an optical isolator 721, an optical coupler 711, an amplification optical fiber 731, an optical coupler 712, an optical isolator 722, and an optical coupler 713 are successively cascaded to one another. Also, in the optical amplifier 700 in accordance with this embodiment, an pumping light source 751 is connected to the optical coupler 711, an pumping light source 752 is connected to the optical coupler 712, and light-receiving devices 741, 742 are connected to the optical coupler 713 by way of an optical coupler 714 and band-pass filters 743, 744. Further, the optical amplifier 700 in accordance with this embodiment is equipped with a temperature control section 761 and an output control section 762.

The optical isolator 721 transmits therethrough light in the direction from the input connector 701 to the optical coupler 711, but not in the opposite direction. The optical coupler 711 outputs to the amplification optical fiber 731 the signal light having arrived from the optical isolator 721, and also outputs to the amplification optical fiber 731 the pumping light outputted from the pumping light source 751. The pumping light source 751 is a semiconductor laser light source, for example, and outputs pumping light with a wavelength which can excite a fluorescent material added to the amplification optical fiber 731.

The amplification optical fiber 731 is an optical waveguide whose core is doped with a fluorescent material excitable with the pumping light outputted from the pumping light sources 751, 752, optically amplifies signal light, and outputs thus amplified signal light. The doping fluorescent material is preferably a rare-earth element, more preferably Er element. Doping with Er element is preferable since signal light in the wavelength band of 1.55 μm can be optically amplified thereby. The amplification optical fiber 731 is wound around a coil bobbin 732 made of a material (e.g., aluminum) which is excellent in thermal conductivity. Attached to the coil bobbin 732 are a Peltier device 733 for adjusting the temperature of the amplification optical fiber 731, and a thermistor 734 for detecting the temperature of the amplification optical fiber 731.

The optical coupler 712 outputs to the optical isolator 722 the signal light outputted from the amplification optical fiber 731, and outputs to the amplification optical fiber 731 the pumping light outputted from the pumping light source 752. The pumping light source 752 is a semiconductor laser light source, for example, and outputs pumping light with a wavelength which can excite the fluorescent material added to the amplification optical fiber 731. The optical isolator 722 transmits therethrough light in the direction from the optical coupler 712 to the optical coupler 713, but not in the opposite direction. The optical coupler 713 causes a part of signal light having arrived from the optical isolator 722 to branch off toward the optical coupler 714, and the remainder to pass therethrough to the output connector 702.

The optical coupler 714 outputs, of the signal light having arrived from the optical coupler 713, different wavelengths of signal light. For example, the optical coupler 714 outputs the shortest wavelength of signal light to the band-pass filter 743, and the longest wavelength of signal light to the band-pass filter 744. The light-receiving device 741 is a photodiode, for example, and detects the power $P_S$ of the shortest wavelength of signal light outputted from the optical coupler 714 and passed through the band-pass filter 743. The light-receiving device 742 is a photodiode, for example, and detects the power $P_L$ of the longest wavelength of signal light outputted from the optical coupler 714 and passed through the band-pass filter 744.

The temperature control section 761 inputs the power $P_S$ of the shortest wavelength of signal light detected by the light-receiving device 741 and the power $P_L$ of the longest wavelength of signal light detected by the light-receiving device 742, and controls the temperature of the amplification optical fiber 731 by way of the Peltier device 733 according to the difference between the respective values of the shortest wavelength signal light power $P_S$ and the longest wavelength signal light power $P_L$. Namely, the temperature control section 761 stores beforehand therein whether the temperature of the amplification optical fiber 731 is to be raised or lowered when $P_S > P_L$, and controls the temperature of the amplification optical fiber 731 so as to reduce the difference between the respective values of the shortest wavelength signal light power $P_S$ and the longest wavelength signal light power $P_L$. For example, in the case where the signal light in L band is to be optically amplified, the temperature of the amplification optical fiber 731 is lowered and raised when $P_S > P_L$ and $P_S < P_L$, respectively. Thus, in this embodiment, the temperature control section 761 feedback-controls the temperature of the amplification optical fiber 731 without monitoring the result of temperature measurement effected by the thermistor 734.

The output control section 762 inputs the power $P_S$ of the shortest wavelength of signal light detected by the light-receiving device 741 and the power $P_L$ of the longest wavelength of signal light detected by the light-receiving device 742, and controls the power of the pumping light supplied to the amplification optical fiber 731 from the pumping light source 752, such that the sum of the respective values of the shortest wavelength signal light power $P_S$ and the longest wavelength signal light power $P_L$ becomes a predetermined target value. Alternatively, the output control section 762 may control the power of the pumping light supplied to the amplification optical fiber 731 from the pumping light source 752, such that one of the respective values of the shortest wavelength signal light power $P_S$ and the longest wavelength signal light power $P_L$ becomes a predetermined target value. Also, the output control section 762 may control the power of the pumping light supplied to the amplification optical fiber 731 from the pumping light source 752, such that the total power of the output signal light or the power of another specific wavelength thereof becomes a predetermined target value.

The optical amplifier 700 in accordance with this embodiment operates as follows. The pumping light outputted from the pumping light source 751 is forwardly supplied to the amplification optical fiber 731 by way of the optical coupler 711, whereas the pumping light outputted from the pumping light source 752 is reversely supplied to the amplification optical fiber 731 by way of the optical coupler 712. The signal light inputted to the input connector 701 successively travels through the optical isolator 721 and the optical coupler 711, so as to be inputted to and optically amplified in the amplification optical fiber 731. The signal light optically amplified in and outputted from the amplification optical fiber 731 successively travels through the optical coupler 712, the optical isolator 722, and the optical coupler 713, so as to be outputted from the output connector 702.

A part of the signal light outputted from the output connector 702 is branched out by the optical coupler 713 and then is demultiplexed by the optical coupler 714. The shortest wavelength of signal light demultiplexed by the optical coupler 714 is transmitted through the band-pass filter 743, whereby the power $P_S$ is detected by the light-receiving device 741. On the other hand, the longest wavelength of signal light demultiplexed by the optical coupler 714 is transmitted through the band-pass filter 744, whereby the power $P_L$ is detected by the light-receiving device 742.

Then, the temperature control section 761 controls the temperature of the amplification optical fiber 731 by way of the Peltier device 733 so as to reduce the difference between the respective values of the shortest wavelength signal light power $P_S$ and the longest wavelength signal light power $P_L$. On the other hand, the output control section 762 controls the power of pumping light supplied to the amplification optical fiber 731 from the pumping light source 752, such that the sum of the respective values of the shortest wavelength signal light power $P_S$ and the longest wavelength signal light power $P_L$ becomes a predetermined target value.

The optical amplifier 700 in accordance with this embodiment not only has the effects obtained by the one in accordance with the first embodiment but also enables more stable operations of optical amplification due to the feedback control of the temperature of the amplification optical fiber 731.

Without being restricted to the above-mentioned embodiments, the present invention can be modified in various manners. For example, the fluorescent material added to the amplification optical fiber is not limited to Er element but may be other rare-earth elements (e.g., Tm element, Pr element, Nd element, and the like). Also, in place of the amplification optical fiber, a planar optical waveguide doped with a fluorescent material excitable with pumping light may be employed.

In the case where both the front- and rear-stage amplification optical fibers are provided, the temperature of the rear-stage amplification optical fiber may be controlled alone not only according to the input signal light power as in the above-mentioned sixth embodiment, but also according to the gain or according to the difference between the respective powers of outputted two or more waves of signal light. Also, in the case where three or more amplification optical fibers are provided, with the most upstream amplification optical fiber being held at room temperature, the temperature of any amplification optical fiber in the second or later stage may be controlled, whereby the noise factor is ameliorated as well.

As explained in detail in the foregoing, in the first optical amplifier and optical amplifier control method in accordance with the present invention, the power of signal light outputted from the optical waveguide is controlled so as to have a predetermined target value, and the temperature of at least a part of the optical waveguide is controlled according to the power of signal light inputted to the optical waveguide. As a consequence, even when the input signal light power fluctuates, the deterioration in optical amplification performances is suppressed, whereby a flatness in gain can easily be maintained.

In the second optical amplifier and optical amplifier control method in accordance with the present invention, the power of signal light outputted from the optical waveguide is controlled so as to have a predetermined target value, and the temperature of at least a part of the optical waveguide is controlled according to the gain of optical amplification in the optical waveguide. As a consequence, even when the input signal light power fluctuates, and even if the fluctuation is caused by fluctuations in wave number, the deterioration in optical amplification performances is suppressed, whereby a flatness in gain can easily be maintained.

In the third optical amplifier and optical amplifier control method in accordance with the present invention, the power of signal light outputted from the optical waveguide is controlled so as to have a predetermined target value, and the temperature of at least a part of the optical waveguide is controlled according to the difference between the respective powers of two or more waves of signal light outputted from the optical waveguide. As a consequence, even when the input signal light power fluctuates, the deterioration in optical amplification performances is suppressed, whereby a flatness in gain can easily be maintained.

Also, since the temperature of the optical waveguide is feedback-controlled, stable operations of optical amplification are possible.

In the case where the optical waveguide is divided into a plurality of sections, and the temperature control means keeps the temperature of the most upstream section of the optical waveguide constant, the deterioration in noise characteristics of the optical waveguide caused by changes in temperature can be avoided in the optical amplifier as a whole.

In the case where the fluorescent material is Er element, signal light can be optically amplified within the signal light wavelength band of 1.53 to 1.60 nm, which is generally used in optical communications systems. In particular, the one in which the optical waveguide optically amplifies signal light within the wavelength range of 1574 to 1601 nm is preferable. In this case, even when the input signal light power fluctuates, a flatness in gain can be maintained over a wide band of 25 nm or more.

What is claimed is:

1. An optical amplifier comprising:
   an optical waveguide, doped with a fluorescent material excitable with pumping light, for optically amplifying signal light;
   pumping means for supplying pumping light to said optical waveguide;
   output control means for controlling signal light outputted from said optical waveguide, such that a power of said signal light becomes a predetermined target value; and
   temperature control means for controlling a temperature of at least a part of said optical waveguide according to a power of the signal light inputted to said optical waveguide.

2. An optical amplifier according to claim 1, wherein said temperature control means changes the target value (unit: K) of temperature of said optical waveguide by $\Delta P/(A \cdot G)$ with respect to the amount of change $\Delta P$ (unit: dB) in power of the signal light inputted to said optical waveguide, where G (unit: dB) is a set center value of a range for adjusting net gain in said part of optical waveguide controlled by said temperature control means, and A (unit: 1/K) is a constant.

3. An optical amplifier comprising:

an optical waveguide, doped with a fluorescent material excitable with pumping light, for optically amplifying signal light;

pumping means for supplying pumping light to said optical waveguide;

output control means for controlling signal light outputted from said optical waveguide, such that a power of said signal light becomes a predetermined target value; and temperature control means for controlling a temperature of at least a part of said optical waveguide according to a gain of optical amplification in said optical waveguide.

4. An optical amplifier according to claim 3, wherein said temperature control means changes the target value (unit: K) of temperature of said optical waveguide by $-\Delta G/(A \cdot G)$ with respect to the amount of change $\Delta G$ (unit: dB) in gain, where G (unit: dB) is a set center value of a range for adjusting net gain in said part of optical waveguide controlled by said temperature control means, and A (unit: 1/K) is a constant.

5. An optical amplifier comprising:

an optical waveguide, doped with a fluorescent material excitable with pumping light, for optically amplifying signal light;

pumping means for supplying pumping light to said optical waveguide;

output control means for controlling signal light outputted from said optical waveguide, such that a power of said signal light becomes a predetermined target value; and temperature control means for controlling a temperature of at least a part of said optical waveguide according to a difference between respective powers of at least two waves of signal light outputted from said optical waveguide.

6. An optical amplifier according to claim 1, wherein said optical waveguide is divided into a plurality of sections, said temperature control means keeping the temperature of the most upstream section of said optical waveguide constant.

7. An optical amplifier according to claim 1, wherein said fluorescent material is Er element.

8. An optical amplifier according to claim 3, wherein said fluorescent material is Er element.

9. An optical amplifier according to claim 5, wherein said fluorescent material is Er element.

10. An optical amplifier according to claim 5, wherein said optical waveguide optically amplifies signal light within a wavelength range of 1574 to 1601 nm.

11. An optical amplifier control method using an optical amplifier comprising:

an optical waveguide, doped with a fluorescent material excitable with pumping light, for optically amplifying signal light; and pumping means for supplying pumping light to said optical waveguide; so as to control the signal light outputted from said optical waveguide, such that a power of said signal light becomes a predetermined target value, and control a temperature of at least a part of said optical waveguide according to a power of the signal light inputted to said optical waveguide.

12. An optical amplifier control method according to claim 11, wherein, for controlling the temperature of said optical waveguide, the target value (unit: K) of temperature of said optical waveguide is changed by $\Delta P/(A \cdot G)$ with respect to the amount of change $\Delta P$ (unit: dB) in power of the signal light inputted to said optical waveguide, where G (unit: dB) is a set center value of a range for adjusting net gain in said part of optical waveguide controlled by said temperature control means, and A (unit: 1/K) is a constant.

13. An optical amplifier control method using an optical amplifier comprising an optical waveguide, doped with a fluorescent material excitable with pumping light, for optically amplifying signal light; and pumping means for supplying pumping light to said optical waveguide; so as to control the signal light outputted from said optical waveguide, such that a power of said signal light becomes a predetermined target value, and control a temperature of at least a part of said optical waveguide according to a gain of optical amplification in said optical waveguide.

14. An optical amplifier control method according to claim 13, wherein, for controlling the temperature of said optical waveguide, the target value (unit: K) of temperature of said optical waveguide is changed by $-\Delta G/(A \cdot G)$ with respect to the amount of change $\Delta G$ (unit: dB) in gain, where G (unit: dB) is a set center value of a range for adjusting net gain in said part of optical waveguide controlled by said temperature control means, and A (unit: 1/K) is a constant.

15. An optical amplifier control method using an optical amplifier comprising an optical waveguide, doped with a fluorescent material excitable with pumping light, for optically amplifying signal light; and pumping means for supplying pumping light to said optical waveguide; so as to control the signal light outputted from said optical waveguide, such that a power of said signal light becomes a predetermined target value, and control a temperature of at least a part of said optical waveguide according to a difference between respective powers of at least two waves of signal light outputted from said optical waveguide.

16. An optical amplifier control method according to claim 11, wherein said optical waveguide is divided into a plurality of sections, and wherein the temperature of the most upstream section thereof is kept constant.

17. An optical amplifier control method according to claim 13, wherein said optical waveguide is divided into a plurality of sections, and wherein the temperature of the most upstream section thereof is kept constant.

18. An optical amplifier control method according to claim 15, wherein said optical waveguide is divided into a plurality of sections, and wherein the temperature of the most upstream section thereof is kept constant.

19. An optical amplifier control method according to claim 11, wherein said fluorescent material is Er element.

20. An optical amplifier control method according to claim 13, wherein said fluorescent material is Er element.

21. An optical amplifier control method according to claim 15, wherein said fluorescent material is Er element.

22. An optical amplifier control method according to claim 19, wherein said optical waveguide optically amplifies signal light within a wavelength range of 1574 to 1601 nm.

23. An optical amplifier control method according to claim 20, wherein said optical waveguide optically amplifies signal light within a wavelength range of 1574 to 1601 nm.

24. An optical amplifier control method according to claim 21, wherein said optical waveguide optically amplifies signal light within a wavelength range of 1574 to 1601 nm.

* * * * *